(12) United States Patent
    Coo

(10) Patent No.: US 10,012,377 B2
(45) Date of Patent: Jul. 3, 2018

(54) DISPLAY DEVICE

(71) Applicant: LG Electronics Inc., Seoul (KR)

(72) Inventor: Jinun Coo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 22 days.

(21) Appl. No.: 15/173,180

(22) Filed: Jun. 3, 2016

(65) Prior Publication Data
    US 2017/0292691 A1    Oct. 12, 2017

(30) Foreign Application Priority Data

Apr. 6, 2016 (KR) .................. 10-2016-0042295

(51) Int. Cl.
| G09F 13/04 | (2006.01) |
| G09F 13/08 | (2006.01) |
| H04N 5/64 | (2006.01) |
| F21V 29/74 | (2015.01) |
| H05K 5/00 | (2006.01) |
| H05K 7/20 | (2006.01) |
| F21V 7/00 | (2006.01) |
| H05K 5/02 | (2006.01) |

(52) U.S. Cl.
CPC ............ *F21V 29/74* (2015.01); *F21V 7/0066* (2013.01); *H05K 5/0017* (2013.01); *H05K 5/0234* (2013.01); *H05K 7/2049* (2013.01); *H05K 7/20436* (2013.01)

(58) Field of Classification Search
USPC ........................................ 362/97.1; 348/794
See application file for complete search history.

(56) References Cited

U.S. PATENT DOCUMENTS

| 6,593,979 B1* | 7/2003 | Ha ................... G02F 1/133308 349/187 |
| 2005/0212982 A1* | 9/2005 | Soga ....................... H04N 5/64 348/825 |
| 2007/0091226 A1* | 4/2007 | Yamanaka ............. H04N 5/64 349/60 |
| 2009/0174838 A1* | 7/2009 | Park .................. G02F 1/133608 349/64 |
| 2009/0219459 A1 | 9/2009 | Kim |
| 2009/0225254 A1* | 9/2009 | Matsuzawa ....... G02F 1/133308 349/58 |

(Continued)

FOREIGN PATENT DOCUMENTS

| EP | 2 899 586 A1 | 7/2015 |
| JP | 2014-206654 A | 10/2014 |

(Continued)

*Primary Examiner* — Tuyen K Vo
(74) *Attorney, Agent, or Firm* — Birch, Stewart, Kolasch & Birch, LLP

(57) ABSTRACT

A display device is disclosed. The display device includes a display panel, a rear case positioned in a rear of the display panel, and of which a back surface is exposed to the outside, a backlight unit positioned between the display panel and the rear case and providing the display panel with light, a plurality of ribs extended from a front surface of the rear case and contacting at least a portion of the backlight unit, a boss forwardly extended from the front surface of the rear case, and a controller positioned between the backlight unit and the rear case and coupled with the boss.

20 Claims, 30 Drawing Sheets

(56) References Cited

U.S. PATENT DOCUMENTS

| | | | |
|---|---|---|---|
| 2011/0316010 A1* | 12/2011 | Baba | G02F 1/133603 257/88 |
| 2013/0038799 A1* | 2/2013 | Namekata | G02B 6/0088 348/725 |
| 2013/0069856 A1* | 3/2013 | Ogura | G09G 3/3406 345/102 |
| 2013/0293806 A1* | 11/2013 | Yu | G02F 1/133524 349/58 |
| 2014/0184928 A1* | 7/2014 | Yokawa | H04R 1/028 348/794 |
| 2014/0204564 A1* | 7/2014 | Mukaide | H04N 5/64 362/97.1 |
| 2014/0233259 A1 | 8/2014 | Jung et al. | |
| 2014/0313424 A1* | 10/2014 | Imajo | G02B 6/0011 348/790 |
| 2015/0022753 A1* | 1/2015 | Akatsuka | G02F 1/133308 349/58 |

FOREIGN PATENT DOCUMENTS

| KR | 10-2011-0133848 A | 12/2011 |
| KR | 10-2013-0006206 A | 1/2013 |
| KR | 10-2014-0108088 A | 9/2014 |
| KR | 10-2015-0137572 A | 12/2015 |

* cited by examiner

DISPLAY DEVICE

This application claims the benefit of Korean Patent Application No. 10-2016-0042295 filed on Apr. 6, 2016, the entire contents of which are incorporated herein by reference for all purposes as if fully set forth herein.

BACKGROUND OF THE INVENTION

Field of the Invention

The present disclosure relates to a display device.

Discussion of the Related Art

With the development of the information society, various demands for display devices have been increasing. Various display devices, such as liquid crystal displays (LCDs), plasma display panels (PDPs), electroluminescent displays (ELDs), and vacuum fluorescent displays (VFDs), have been recently studied and used to meet various demands for the display devices.

Among the display devices, a liquid crystal display panel of the liquid crystal display includes a liquid crystal layer, and a thin film transistor (TFT) substrate and a color filter substrate which are positioned opposite each other with the liquid crystal layer interposed therebetween. The liquid crystal display panel displays an image using light provided by a backlight unit of the liquid crystal display.

SUMMARY OF THE INVENTION

In one aspect, there is provided a display device comprising a display panel, a rear case in a rear of the display panel, a back surface of the rear case being exposed to the outside, a backlight unit between the display panel and the rear case and providing the display panel with light, and a plurality of ribs extended from a front surface of the rear case and contacting at least a portion of the backlight unit.

According to another aspect of the present disclosure, there is provided a display device comprising a display panel, a rear case in a rear of the display panel, a back surface of the rear case being exposed to the outside, a backlight unit between the display panel and the rear case and providing the display panel with light, a plurality of ribs extended from a front surface of the rear case and contacting at least a portion of the backlight unit, a boss forwardly extended from the front surface of the rear case, and a controller between the backlight unit and the rear case and coupled with the boss.

According to another aspect of the present disclosure, the display device may further comprise a controller between the rear case and the backlight unit and fixed to the rear case. The rear case may include at least one opening adjacent to the controller. A portion of the controller may be exposed to the outside through a back surface of the rear case.

According to another aspect of the present disclosure, the controller may be a main board or a power supply unit.

According to another aspect of the present disclosure, the display device may further comprise a plate between the rear case and the backlight unit and a controller between the plate and the rear case. The plate may cover the controller, and the controller and the plate may be fixed to the rear case.

According to another aspect of the present disclosure, the display device may further comprise a plate between the rear case and the backlight unit and a speaker at the front surface of the rear case. The plate may cover at least a portion of the speaker.

According to another aspect of the present disclosure, the display device may further comprise a plate between the rear case and the backlight unit and fixed to the rear case. The backlight unit may include a substrate and a light assembly mounted on the substrate. The substrate may be attached to the plate.

According to another aspect of the present disclosure, the backlight unit may further include a reflective sheet between the plate and the display panel and having a hole, into which at least a portion of the light assembly is inserted. At least one of the plurality of ribs may support a back surface of the reflective sheet. A coupling portion protruding from a side of the reflective sheet may be fixed to at least another of the plurality of ribs.

According to another aspect of the present disclosure, the backlight unit may further include an optical sheet between the reflective sheet and the display panel. A coupling portion protruding from a side of the optical sheet may be fixed to at least one of the plurality of ribs.

According to another aspect of the present disclosure, the rear case may include a bottom forming a bottom surface, an inclined portion extended from the bottom toward the display panel while being close to the display panel, and a side portion extended from the inclined portion and forming an outer portion of the rear case. The display device may further comprises a guide panel positioned in front of the inclined portion or the side portion, supported by at least one of the plurality of ribs, and supporting a portion of a back surface of the display panel.

According to another aspect of the present disclosure, the guide panel may include a horizontal portion supported by at least one of the plurality of ribs, a vertical portion connected to the horizontal portion and positioned opposite a side of the display panel, and a pressing portion on a lower surface of the horizontal portion and contacting a portion of a front surface of the optical sheet.

According to another aspect of the present disclosure, at least one of the plurality of ribs, which is adjacent to the horizontal portion, may include a groove. The guide panel may include a hook inserted into the groove.

According to another aspect of the present disclosure, the display device may further comprise an adhesive member between the horizontal portion and the display panel and attached to both the horizontal portion and the display panel.

According to another aspect of the present disclosure, the display device may further comprise a front cover covering a portion of a front surface of the display panel and coupled with the rear case at a side of the rear case.

According to another aspect of the present disclosure, the rear case may include a bottom forming a bottom surface, an inclined portion extended from the bottom toward the display panel while being close to the display panel, a side portion extended from the inclined portion and forming an outer portion of the rear case, and a side rib extended from the side portion toward the front cover and having a groove. The front cover may include a hook inserted into the groove.

According to another aspect of the present disclosure, the rear case may include a bottom forming a bottom surface of the rear case, an inclined portion extended from an edge of the bottom toward an edge of the display panel, a side portion in a rear of the edge of the display panel and extended from the inclined portion, a support rib extended from the bottom or the inclined portion toward a front of the rear case, and a fixing rib positioned on the side portion to be adjacent to the inclined portion and extended toward the front of the rear case. The backlight unit may include a reflective sheet positioned between the display panel and the rear case to be opposite to the bottom, supported by the support rib, and hung on the fixing rib, an optical sheet between the display panel and the reflective sheet and hung on the fixing rib, and a guide panel supported from an upper end of the fixing rib and supporting an outer portion of a back surface of the display panel, a portion of the guide panel being positioned between the display panel and the optical sheet.

According to another aspect of the present disclosure, the display device may further comprise a plurality of bosses extended toward a front of the rear case at a front surface of the rear case, a guide rib adjacent to at least one of the plurality of bosses and extended toward the front of the rear case at the front surface of the rear case, and a controller including a first hole inserted into an upper end of the guide rib and a second hole formed at a location corresponding to the boss.

According to another aspect of the present disclosure, the display device may further comprise a plate positioned in front of the controller and including a plurality of holes. One of the plurality of holes of the plate and the second hole of the controller may be coupled with one of the plurality of bosses.

According to another aspect of the present disclosure, the display device may further comprise a holder positioned on one side or one corner of the plate, contacting or facing a side surface of the plate, and limiting a location of the plate.

According to another aspect of the present disclosure, the display device may further comprise a plate separated from the rear case and positioned adjacent to the backlight unit and at least one boss forwardly extended from the rear case and coupled with the plate.

According to another aspect of the present disclosure, at least a portion of the backlight unit may contact the plate or may be attached to the plate.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
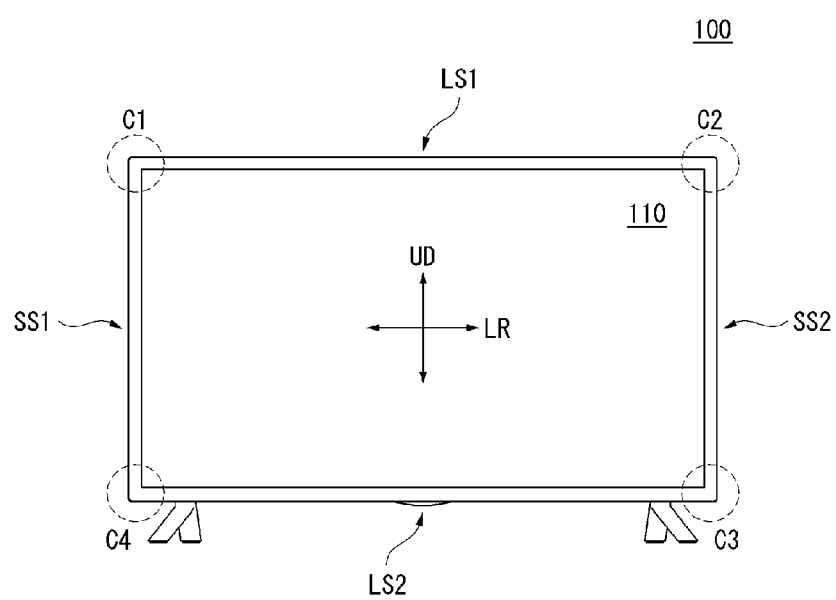
FIGS. 1 to 3 illustrate examples of a display device according to an example embodiment of the invention.

Reference will now be made in detail to embodiments of the invention, examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, the embodiments of the invention are described using a liquid crystal display panel as an example of a display panel. Other display panels may be used. For example, a plasma display panel (PDP), a field emission display (FED) panel, and an organic light emitting diode (OLED) display panel may be used.

In what follows, a display device 100 may include a first long side LS1, a second long side LS2 opposite the first long side LS1, a first short side SS1 adjacent to the first long side LS1 and the second long side LS2, and a second short side SS2 opposite the first short side SS1.

In the embodiment disclosed herein, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area and is positioned between the first side area and the second side area, and is opposite to the third side area.

The embodiment of the invention describes that lengths of the first and second long sides LS1 and LS2 are longer than lengths of the first and second short sides SS1 and SS2 for the sake of brevity and ease of reading. However, the lengths of the first and second long sides LS1 and LS2 may be almost equal to the lengths of the first and second short sides SS1 and SS2.

In the following description, a first direction DR1 may be a direction parallel to the long sides LS1 and LS2 of the display device 100, and a second direction DR2 may be a direction parallel to the short sides SS1 and SS2 of the display device 100. Further, a third direction DR3 may be a direction vertical to the first direction DR1 and/or the second direction DR2.

In the embodiment disclosed herein, the first direction DR1 and the second direction DR2 may be commonly referred to as a horizontal direction. Further, the third direction DR3 may be referred to as a vertical direction.

In another point of view, a side or a surface, on which the display device 100 displays an image, may be referred to as a front side or a front surface. When the display device 100 displays the image, a side or a surface, at which the image cannot be observed, may be referred to as a back side or a back surface. When the display device 100 is observed at the front side or the front surface, the first long side LS1 may be referred to as an upper side or an upper surface. In the same manner as the first long side LS1, the second long side LS2 may be referred to as a lower side or a lower surface. Further, the first short side SS1 may be referred to as a left side or a left surface, and the second short side SS2 may be referred to as a right side or a right surface.

Further, the first long side LS1, the second long side LS2, the first short side SS1, and the second short side SS2 may be referred to as edges of the display device 100. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

In the embodiment disclosed herein, a direction from the first short side SS1 to the second short side SS2 or a direction from the second short side SS2 to the first short side SS1 may be referred to as a left-right direction LR. A direction from the first long side LS1 to the second long side LS2 or from the second long side LS2 to the first long side LS1 may be referred to as an up-down direction UD.

Figure 2:
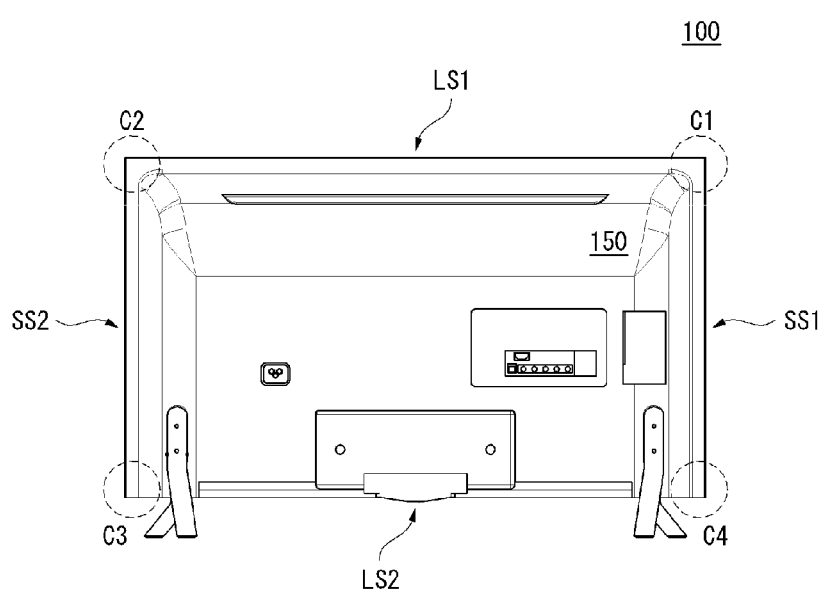
Figure 3:
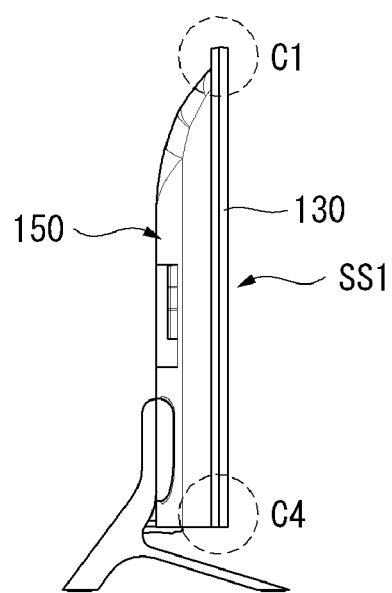

FIGS. 1 to 3 illustrate examples of a display device according to an example embodiment of the invention.

Referring to FIG. 1, a display panel 110 may be positioned at a front surface of the display device 100 and may display an image. The display panel 110 may divide the image into a plurality of pixels and may output the image while controlling color, brightness, and chroma of each pixel.

The display panel 110 may include an active area, on which the image is displayed, and an inactive area, on which the image is not displayed. The display panel 110 may include a front substrate and a back substrate which are positioned opposite each other with a liquid crystal layer interposed therebetween.

The front substrate may include a plurality of pixels each including red, green, and blue subpixels. The front substrate may generate an image corresponding to the red, green, or blue color in response to a control signal.

The back substrate may include switching elements. The back substrate may turn on or off pixel electrodes. For example, the pixel electrode may change an arrangement of molecules of the liquid crystal layer in response to a control signal received from the outside. The liquid crystal layer may include a plurality of liquid crystal molecules. The arrangement of the liquid crystal molecules may change depending on a voltage difference between the pixel electrode and a common electrode. The liquid crystal layer may transfer light provided by a backlight unit to the front substrate.

Referring to FIG. 2, a rear case 150 may function to support components of the display device 100. The rear case 150 may be coupled with the component, for example, the backlight unit of the display device 100. The backlight unit may include substrates 172 and 174, light assemblies 172L and 174L, a reflective sheet 170, and/or an optical sheet 180 which are described later. In the embodiment disclosed herein, the backlight unit is a concept used for the sake of brevity and ease of reading. Thus, the backlight unit may further include other components in addition to the above-mentioned components, or may exclude some of the above-mentioned components. Namely, the backlight unit is positioned in the rear of the display panel 110 and is used to provide light for the display panel 110. In other words, the components of the backlight unit are not limited to the substrates 172 and 174, the light assemblies 172L and 174L, the reflective sheet 170, and/or the optical sheet 180.

The rear case 150 may be formed in the rear of the display device 100 or at a back surface of the display device 100. The rear case 150 may protect an inner configuration of the display device 100 from the outside. At least a portion of the rear case 150 may be coupled with a front cover 130 (See FIG. 3). The rear case 150 may be an injection molded part made of a resin material.

Referring to FIG. 3, the front cover 130 may cover at least a portion of a front surface and a side surface of the display panel 110. The front cover 130 may have a rectangular frame shape, in which a center portion is empty. Because the center portion of the front cover 130 is empty, an image displayed on the display panel 110 may be seen to the outside.

The front cover 130 may include a front cover and a side cover. Namely, the front cover 130 may include the front cover positioned at the front surface of the display panel 110 and the side cover positioned on the side of the display panel 110. The front cover and the side cover may be separately configured.

One of the front cover and the side cover may be omitted. For example, the front cover may be omitted, and only the side cover may exist in terms of an attractive appearance of the display device 100.

FIGS. 4 to 8 illustrate examples of a rear case according to an example embodiment of the invention.

Figure 4:
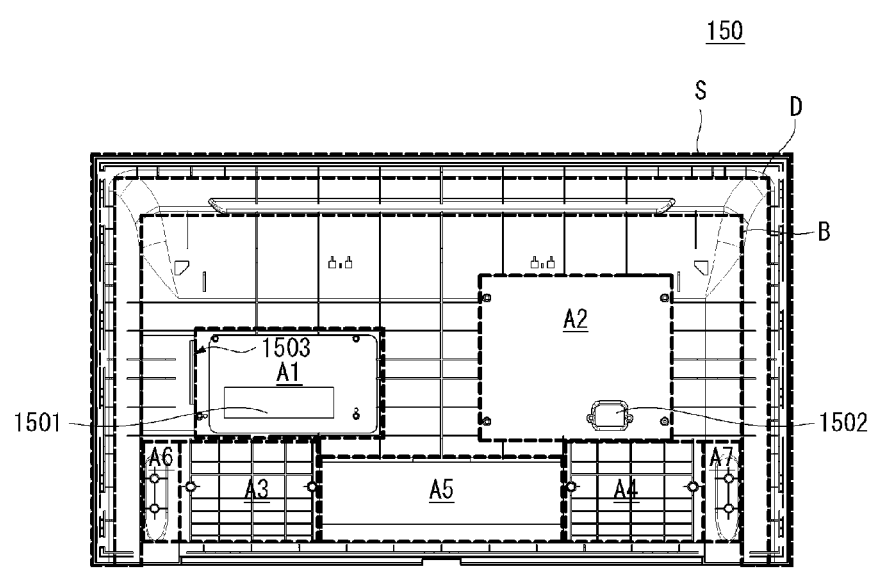
FIGS. 4 to 8 illustrate examples of a rear case according to an example embodiment of the invention.

Referring to FIG. 4, the rear case 150 may have an inner receiving space. The inner receiving space may be an installation space for the components of the display device 100.

The rear case 150 may include a bottom or rear most portion B, an inclined portion D, and a side portion S. The bottom B may form a bottom surface of the rear case 150. The bottom B may form the back surface of the display device 100. The bottom B may include a rib, so as to secure a bending rigidity or a twist rigidity of the rear case 150. The bottom B may include a plurality of ribs at its front surface in a left-right direction or an up-down direction.

The bottom B may include an opening. The bottom B may include a plurality of openings 1501, 1502, and 1503. The openings 1501, 1502, and 1503 may be formed on the left side and/or the right side of the bottom B. The bottom B may include a plurality of installation areas A1 to A7.

The first installation area A1 may be positioned in the center of the left side of the bottom B. For example, a main board may be installed in the first installation area A1. The first installation area A1 may include the opening 1501. When the main board is positioned in the first installation area A1, terminals formed on one surface of the main board may be exposed to the outside of the rear case 150 or the outside of the display device 100 through the opening 1501. Hence, a cable positioned outside the rear case 150 or outside the display device 100 may be directly connected to the main board.

The first installation area A1 may include the plurality of openings 1501 and 1503. The first opening 1501 may be positioned on the plane of the first installation area A1. The second opening 1503 may be positioned on the side of the first installation area A1. The main board may include terminals on the plane of the main board and may include terminals on the side of the main board. The terminals on the plane of the main board may be exposed to the outside through the first opening 1501, and the terminals on the side of the main board may be exposed to the outside through the second opening 1503.

In other words, the first installation area A1 may include the plurality of openings 1501 and 1503 on the different planes. The first opening 1501 may be positioned on a front surface or a back surface of the first installation area A1. The second opening 1503 may be positioned on the side of the first installation area A1.

The second installation area A2 may be positioned in the center of the right side of the bottom B. For example, a power supply unit may be installed in the second installation area A2. The second installation area A2 may include the opening 1502. When the power supply unit is positioned in the second installation area A2, terminals formed on one surface of the power supply unit may be exposed to the outside of the rear case 150 or the outside of the display device 100 through the opening 1502. Hence, a cable positioned outside the rear case 150 or outside the display device 100 may be directly connected to the power supply unit. The opening 1502 may be referred to as the third opening 1502.

The third installation area A3 may be positioned on the lower left side of the bottom B. The fourth installation area A4 may be positioned on the lower right side of the bottom B. The third installation area A3 and the fourth installation area A4 may be respectively positioned on the left and right sides of the bottom B. For example, a speaker unit may be installed in the third installation area A3 or the fourth installation area A4.

The fifth installation area A5 may be positioned in the center of the lower side of the bottom B. For example, a timing control board (T-CON board) may be installed in the fifth installation area A5.

The sixth installation area A6 and the seventh installation area A7 may be positioned on the lower leftmost side and the lower rightmost side of the bottom B. For example, a stand may be installed in the sixth installation area A6 or the seventh installation area A7.

Figure 5:
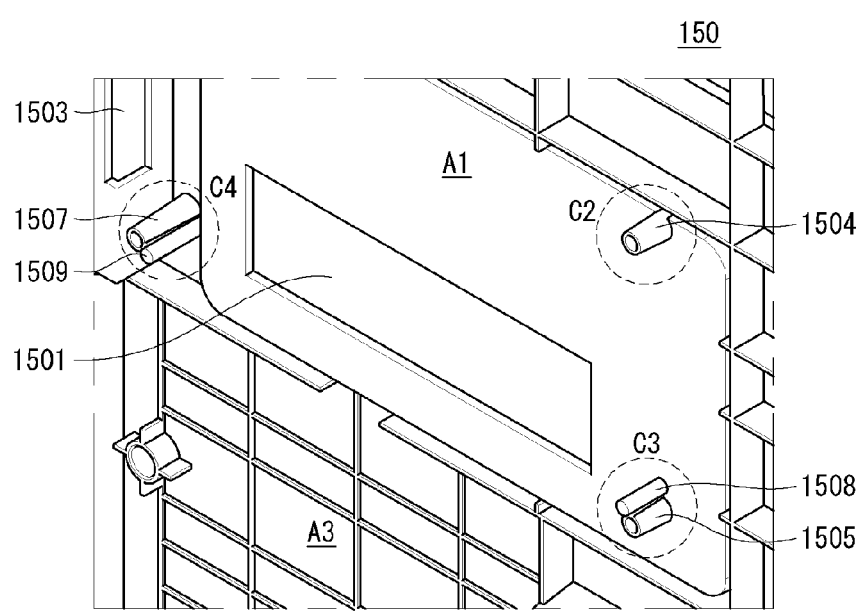

Referring to FIG. 5, the first installation area A1 may include the first opening 1501 and the second opening 1503. The first opening 1501 may be formed on the plane of the bottom B. In this instance, the bottom B may have a side surface formed by bending from the plane. The second opening 1503 may be formed on the side of the bottom B.

The first installation area A1 may include bosses 1504, 1505, and 1507. The bosses 1504, 1505, and 1507 may be formed adjacent to the corner of the first installation area A1. The first installation area A1 may include the plurality of bosses 1504, 1505, and 1507. The first boss 1504 may be formed adjacent to a second corner C2 of the first installation area A1, and the second boss 1505 may be formed adjacent to a third corner C3 of the first installation area A1. The third boss 1507 may be formed adjacent to a fourth corner C4 of the first installation area A1. Although not shown, a fourth boss may be formed adjacent to a first corner C1 of the first installation area A1. In the embodiment disclosed herein, a reference numeral "1506" is given to the fourth boss for the sake of brevity and ease of reading.

Guide ribs 1508 and 1509 may be formed adjacent to or around at least one of the plurality of bosses 1504, 1505, 1506, and 1507, or may be integrated with at least one of the plurality of bosses 1504, 1505, 1506, and 1507. The guide ribs 1508 and 1509 may align a location of the main board which will be coupled with the first installation area A1. The guide ribs 1508 and 1509 may include the plurality of guide ribs 1508 and 1509. The first guide rib 1508 may be formed at the second boss 1505, and the second guide rib 1509 may be formed at the third boss 1507.

The first guide rib 1508 and/or the second guide rib 1509 may have a height greater than a height of the second boss 1505 and/or the third boss 1507. Namely, the first guide rib 1508 and/or the second guide rib 1509 may upwardly protrude from the second boss 1505 and/or the third boss 1507. Hence, the main board may be aligned without change in its location while inserting into the guide ribs 1508 and 1509.

Figure 6:
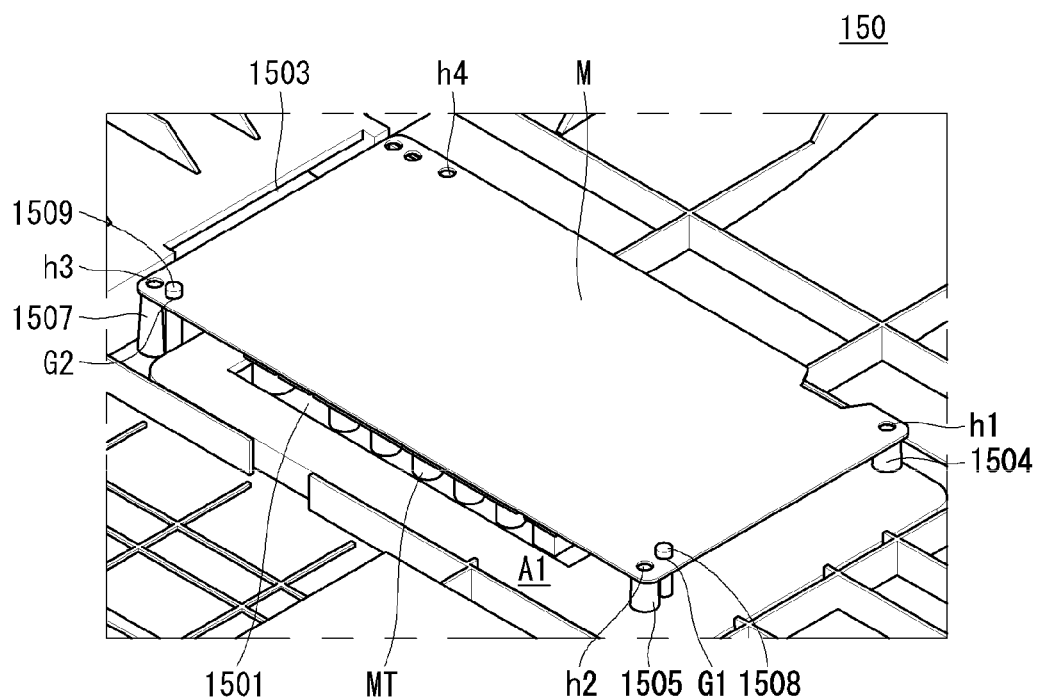

Referring to FIG. 6, a main board M may be installed in the first installation area A1. The main board M may be positioned on the plurality of bosses 1504, 1505, 1506, and 1507. The main board M may include a plurality of fastening holes h1 to h4 corresponding to the plurality of bosses 1504, 1505, 1506, and 1507. Terminals MT on the plane of the main board M may be exposed to the outside of the rear case 150 through the first opening 1501. Further, terminals on the side of the main board M may be exposed to the outside of the rear case 150 through the second opening 1503.

The main board M may be inserted onto the guide ribs 1508 and 1509. The main board M may include guide holes G1 and G2. The first guide rib 1508 may be inserted into the guide hole G1 of the main board M, and the second guide rib 1509 may be inserted into the guide hole G2 of the main board M. Hence, even if the main board M is not coupled with the boss by a fastening member, the location of the main board M may be fixed in the first installation area A1.

Figure 7:
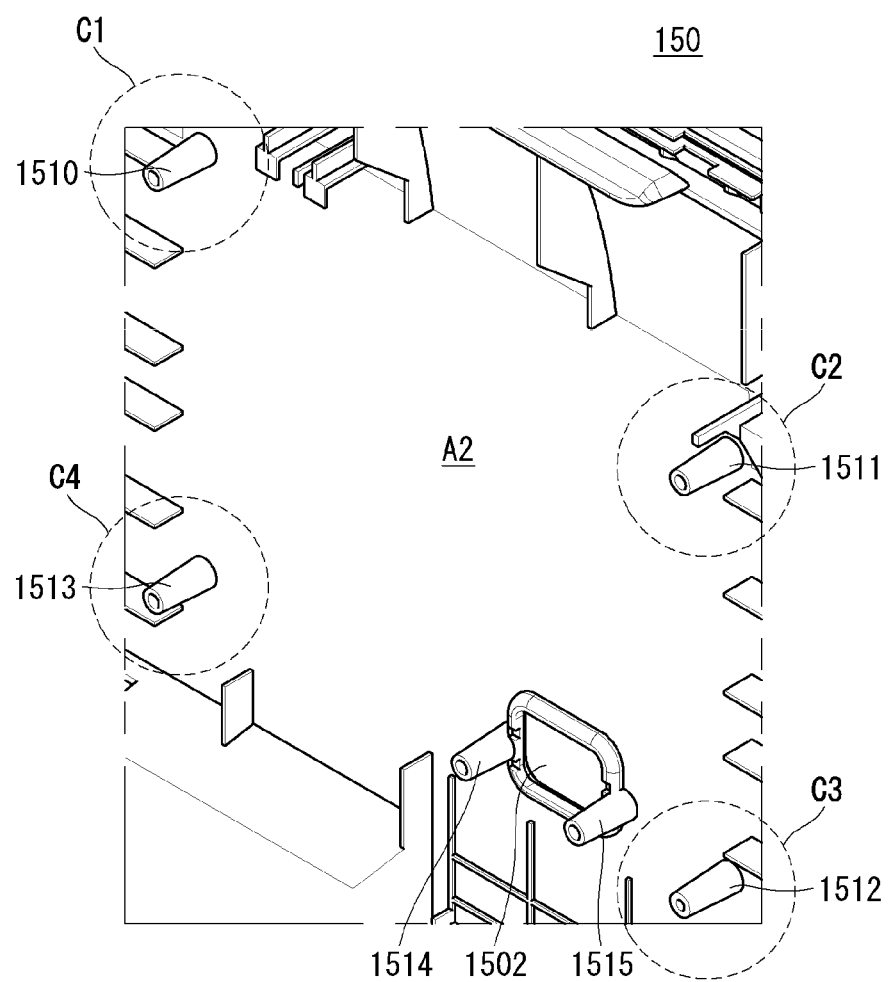

Referring to FIG. 7, the second installation area A2 may include a plurality of bosses 1510, 1511, 1512, and 1513. The first boss 1510 may be positioned adjacent to a first corner C1 of the second installation area A2, and the second boss 1511 may be positioned adjacent to a second corner C2 of the second installation area A2. The third boss 1512 may be positioned adjacent to a third corner C3 of the second installation area A2, and the fourth boss 1513 may be positioned adjacent to a fourth corner C4 of the second installation area A2. The third opening 1502 may be formed on the plane of the second installation area A2. In this instance, the third opening 1502 may be positioned between the third corner C3 and the fourth corner C4 of the second installation area A2.

Figure 8:
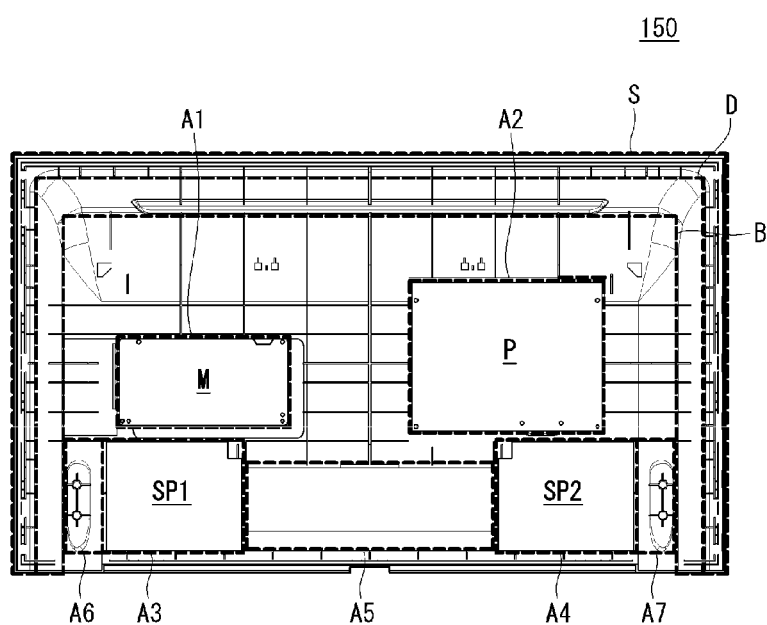

Referring to FIG. 8, the main board M may be installed in the first installation area A1. A power supply unit P may be installed in the second installation area A2. A speaker SP1 may be installed in the third installation area A3. A speaker SP2 may be installed in the fourth installation area A4.

For example, the main board M may be positioned in the first installation area A1 in a state where it is not fixed. The power supply unit P may be an inserted state in the second installation area A2. Namely, the power supply unit P may be a pressed state in the second installation area A2. The speakers SP1 and SP2 may be positioned in the third installation area A3 or the fourth installation area A4 and may be an inserted state or a pressed state in the third installation area A3 or the fourth installation area A4.

The power supply unit P may be a printed circuit board supplying electric power to the display device 100. The power supply unit P may convert an alternating current into a direct current.

The power supply unit P may be electrically connected to the main board M. The main board M may be a printed circuit board providing an interface for operating the display device 100. Further, the main board M may check and control an operation state of the components of the display device 100.

The main board M may be referred to as a controller. The power supply unit P may be referred to as a controller. The controller may include the main board M and/or the power supply unit P.

FIGS. 9 to 12 illustrate examples of a plate assembly according to an example embodiment of the invention.

Figure 9:
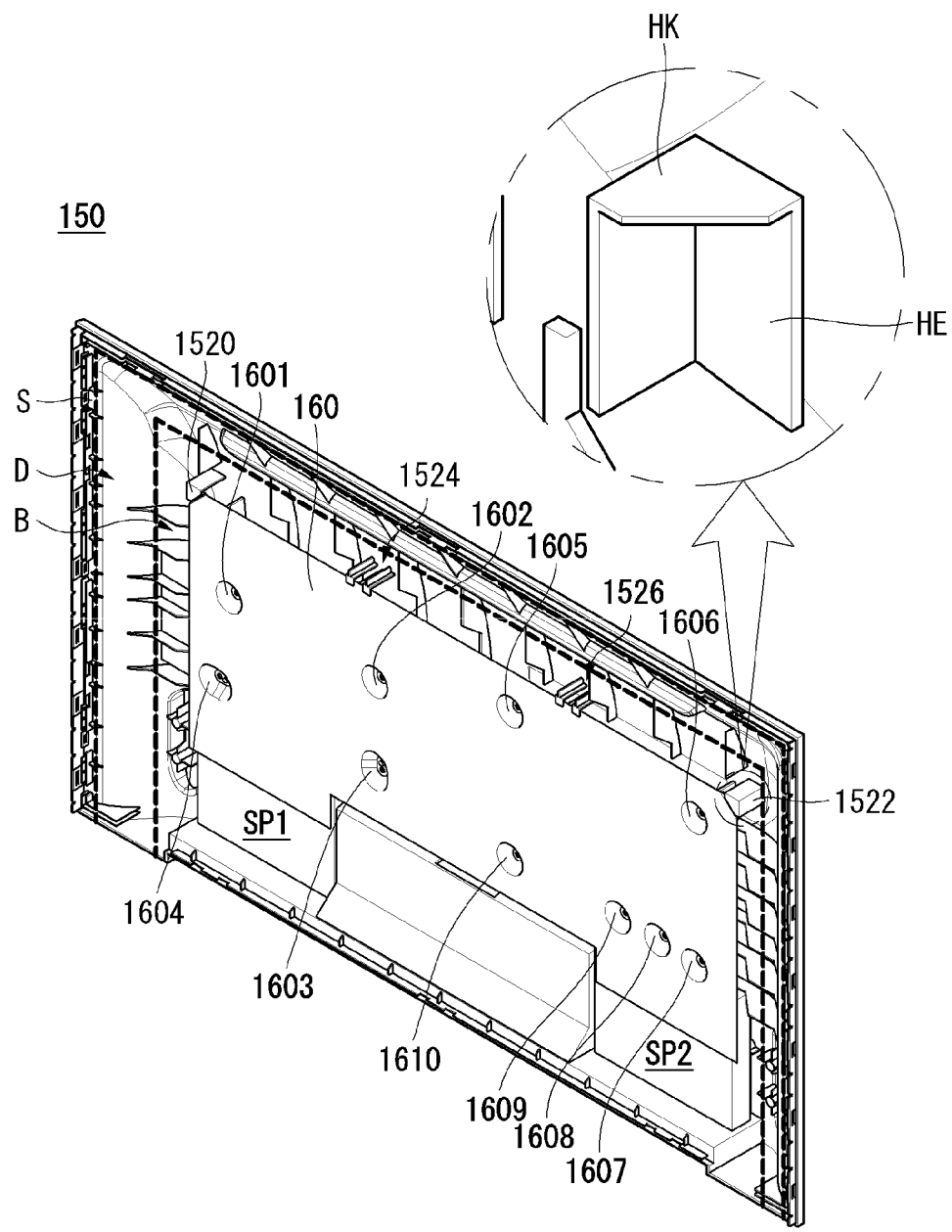
FIGS. 9 to 12 illustrate examples of a plate assembly according to an example embodiment of the invention.

Referring to FIG. 9, a plate 160 may cover at least a portion of the first installation area A1, the second installation area A2, the third installation area A3, the fourth installation area A4, and/or the fifth installation area A5. The plate 160 may entirely cover the first and second installation areas A1 and A2 and cover a portion of each of the third and fourth installation areas A3 and A4.

The plate 160 may cover the main board M, the power supply unit P, and the speakers SP1 and SP2. In this instance, the plate 160 may entirely cover the main board M and the power supply unit P and cover a portion of an upper part of each of the speakers SP1 and SP2. Hence, the speakers SP1 and SP2 may be fixed to the rear case 150.

For example, the plate 160 may be a thin metal plate. The plate 160 may include metal with good heat dissipation efficiency, for example, iron (Fe) or aluminum (Al). The plate 160 may absorb heat generated around the plate 160 and widely distribute heat absorbed from the inside of the display device 100. Namely, the plate 160 may be a heat dissipation plate.

Further, the plate 160 may intercept electromagnetic waves generated in the main board M, the power supply unit P, etc.

Further, the plate 160 may ground the main board M, the power supply unit P, etc. or absorb a voltage impact or a current impact generated in the main board M, the power supply unit P, etc.

The plate 160 may have a plurality of holes 1601 to 1610. The plurality of holes 1601 to 1610 may be formed at a location corresponding to the above-described bosses. A screw may be inserted into each of the plurality of holes 1601 to 1610. Hence, the plate 160 may be coupled with the rear case 150.

Figure 10:
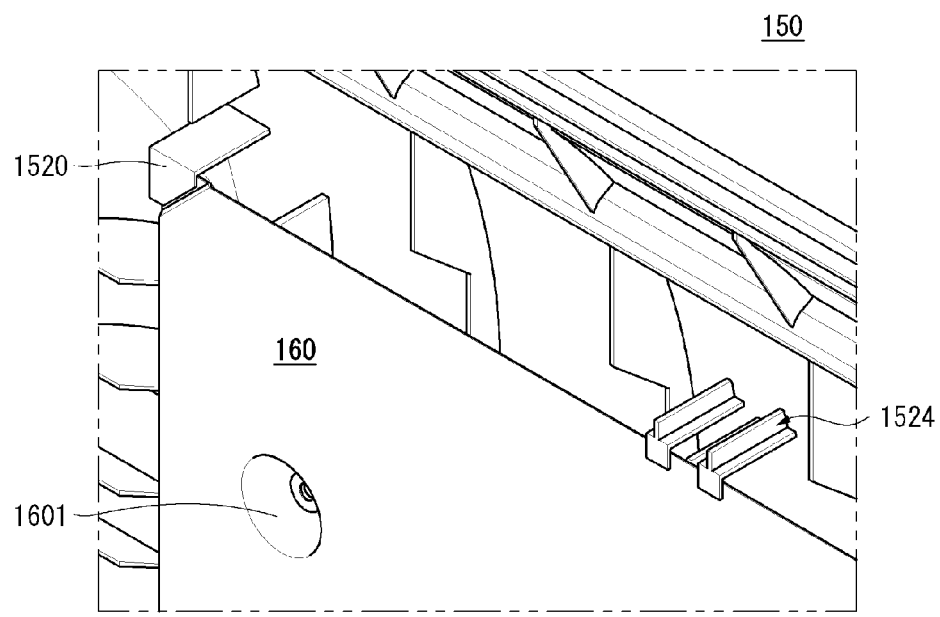

Referring to FIGS. 9 and 10, the rear case 150 may include holders 1520, 1522, 1524, and 1526. The holders 1520, 1522, 1524, and 1526 may be positioned on one side or the corner of the plate 160. When the plate 160 is placed on the rear case 150, the holders 1520, 1522, 1524, and 1526 may limit a location range of the plate 160.

The holders 1520, 1522, 1524, and 1526 may include an extension HE protruding from the bottom B of the rear case 150. The holders 1520, 1522, 1524, and 1526 may further include a hanging portion HK bending from a top of the extension HE. A location of the side of the plate 160 may be limited by the extension HE, and a location of an upper surface of the plate 160 may be limited by the hanging portion HK.

The holders 1520 and 1522 may be positioned on the upper left corner or the upper right corner of the plate 160. Further, the holders 1524 and 1526 may be positioned on the upper side of the plate 160. For example, the holders 1520 and 1522 may be respectively positioned on the upper left corner and the upper right corner of the plate 160, and the two holders 1524 and 1526 may be sequentially positioned on the upper side of the plate 160.

The holes 1601 to 1604 of the plate 160 may be coupled with the bosses 1504, 1505, 1506, and 1507 formed in the first installation area A1 through screws. The holes 1605 to 1610 of the plate 160 may be may be coupled with the bosses 1510, 1511, 1512, 1513, 1514, and 1515 formed in the second installation area A2 through screws. Because the plate 160 is coupled with the bosses formed in the first installation area A1 or the second installation area A2 through the screws, the main board M and/or the power supply unit P may be coupled with the rear case 150.

Figure 11:
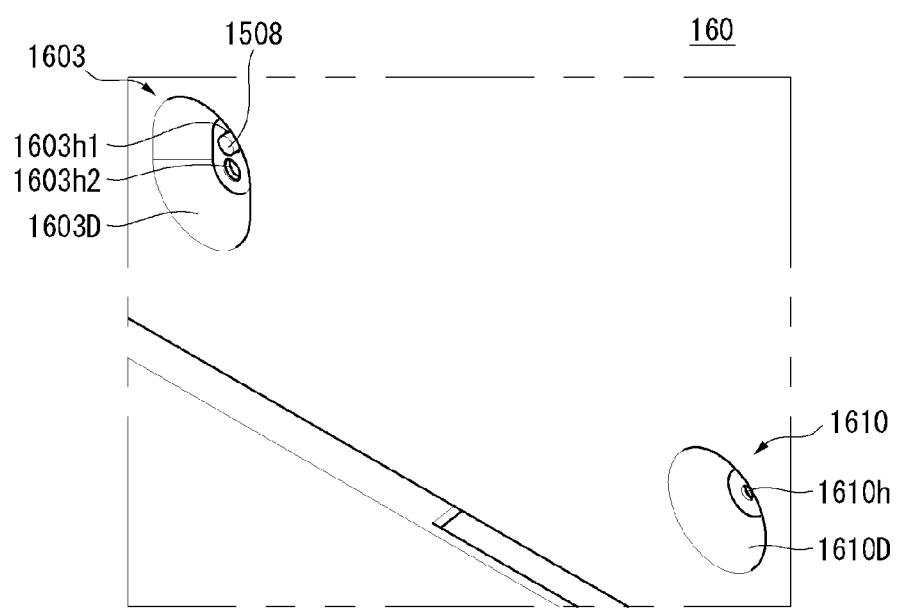

Referring to FIG. 11, the hole 1603 may include a depression 1603D and an opening 1603h. The depression 1603D may be concavely depressed from the plane of the plate 160. The opening 1603h may be formed in the depression 1603D. One opening 1603h or a plurality of openings 1603h may be formed in the depression 1603D. For example, the first guide rib 1508 formed in the first installation area A1 may be inserted into a first opening 1603h1, and the boss 1505 formed in the first installation area A1 may correspond to a second opening 1603h2.

Figure 12:
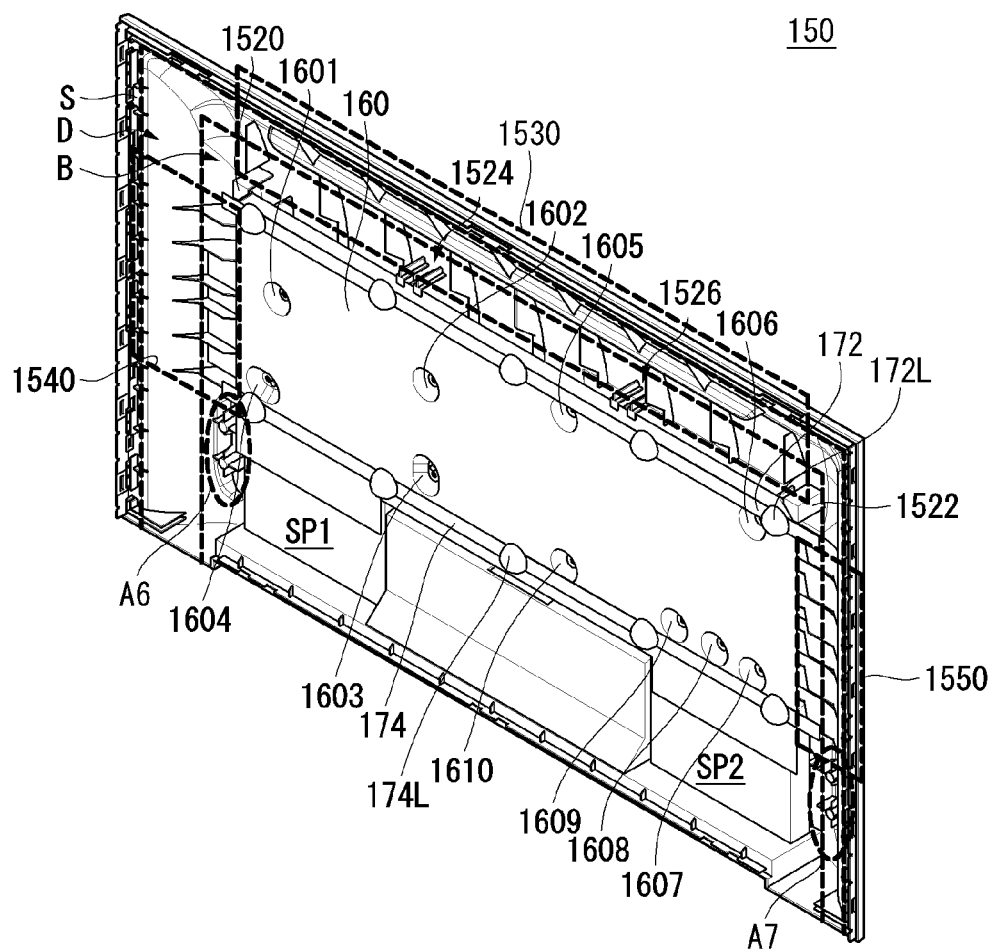

Referring to FIG. 12, the substrates 172 and 174 may be positioned on the plate 160. The substrates 172 and 174 may have an extended shape. The substrates 172 and 174 may be extended in a left-right direction of the plate 160. The substrates 172 and 174 may include a plurality of substrates 172 and 174, and the plurality of substrates 172 and 174 may be arranged on the upper and lower sides of the plate 160.

The first substrate 172 and the second substrate 174 may be arranged in parallel with each other. The substrates 172 and 174 may be fixed to the plate 160 using, for example, a double-sided tape.

Each of the substrates 172 and 174 may be extended in the first direction and may be configured as a plurality of straps disposed in the first direction at predetermined intervals.

At least one light assembly (for example, the light assemblies 172L and 174L) may be mounted on the substrates 172 and 174. The substrates 172 and 174 may have an electrode pattern for connecting an adaptor to the light assemblies 172L and 174L. For example, a carbon nanotube electrode pattern for connecting the adaptor to the light assemblies 172L and 174L may be formed on the substrates 172 and 174.

The substrates 172 and 174 may be formed of at least one of polyethylene terephthalate (PET), glass, polycarbonate (PC), and silicon. The substrates 172 and 174 may be a printed circuit board (PCB), on which at least one light assembly is mounted.

The light assemblies 172L and 174L may be disposed on the substrates 172 and 174 in the first direction at predetermined intervals. Diameters of the light assemblies 172L and 174L may be greater than widths of the substrates 172 and 174. Namely, the diameters of the light assemblies 172L and 174L may be greater than lengths of the substrates 172 and 174 in the second direction.

The light assemblies 172L and 174L may be a light emitting diode (LED) chip or a LED package having at least one LED chip.

The light assemblies 172L and 174L may be configured as a colored LED emitting at least one of red, green, and blue light or a white LED. The colored LED may include at least one of a red LED, a green LED, and a blue LED.

Light sources included in the light assemblies 172L and 174L may be a COB (Chip-On-Board) type. The COB light source may be configured such that the LED chip as the light source is directly coupled with the substrates 172 and 174. Thus, a process may be simplified.

Further, a resistance may be reduced, and a loss of energy resulting from heat may be reduced. Namely, power efficiency of the light assemblies 172L and 174L may increase. The COB light source may provide the brighter lighting and may be implemented to be thinner and lighter than a related art.

The first substrate 172 may have the light assembly 172L, and the second substrate 174 may have the light assembly 174L. The first substrate 172 and/or the second substrate 174 may have the plurality of light assemblies 172L and 174L.

Support ribs 1530, 1540, and 1550 may be formed around the bottom B. The plurality of support ribs 1530, 1540, and 1550 may be formed around the bottom B. The plurality of first support ribs 1530 may be positioned adjacent to the upper side of the bottom B around the bottom B. The plurality of second support ribs 1540 may be positioned adjacent to the right side of the bottom B around the bottom B, and the plurality of third support ribs 1530 may be positioned adjacent to the left side of the bottom B around the bottom B.

The plurality of support ribs 1530, 1540, and 1550 may be sequentially arranged. For example, the plurality of first support ribs 1530 may be sequentially arranged on the upper side of the bottom B in the left-right direction. For example, the plurality of second support ribs 1540 may be sequentially arranged on the right side of the bottom B in the up-down direction.

The plurality of support ribs 1530, 1540, and 1550 may be extended from the bottom B to the inclined portion D. Namely, most of the support ribs 1530, 1540, and 1550 may be positioned around the bottom B, and a portion of the support ribs 1530, 1540, and 1550 may be positioned on the inclined portion D. Thus, the plurality of support ribs 1530, 1540, and 1550 may be formed on the bottom B and the inclined portion D.

The plurality of support ribs 1530, 1540, and 1550 may be formed on the side portion S. Namely, the plurality of support ribs 1530, 1540, and 1550 may be formed on the bottom B, the inclined portion D, and/or the side portion S. The plurality of support ribs 1530, 1540, and 1550 may be successively formed on the bottom B, the inclined portion D, and the side portion S, or may be intermittently formed on the bottom B, the inclined portion D, and the side portion S.

Figure 13:
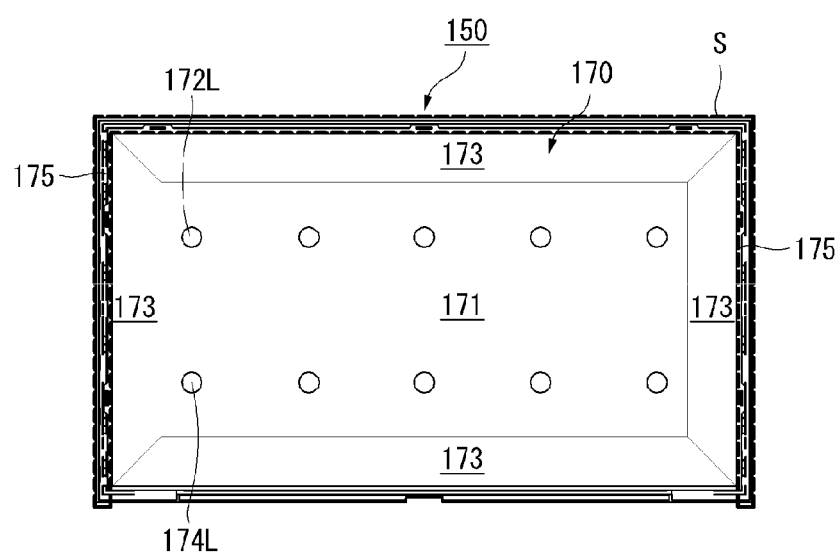
FIGS. 13 to 15 illustrate examples of a reflective sheet according to an example embodiment of the invention.
Figure 14:
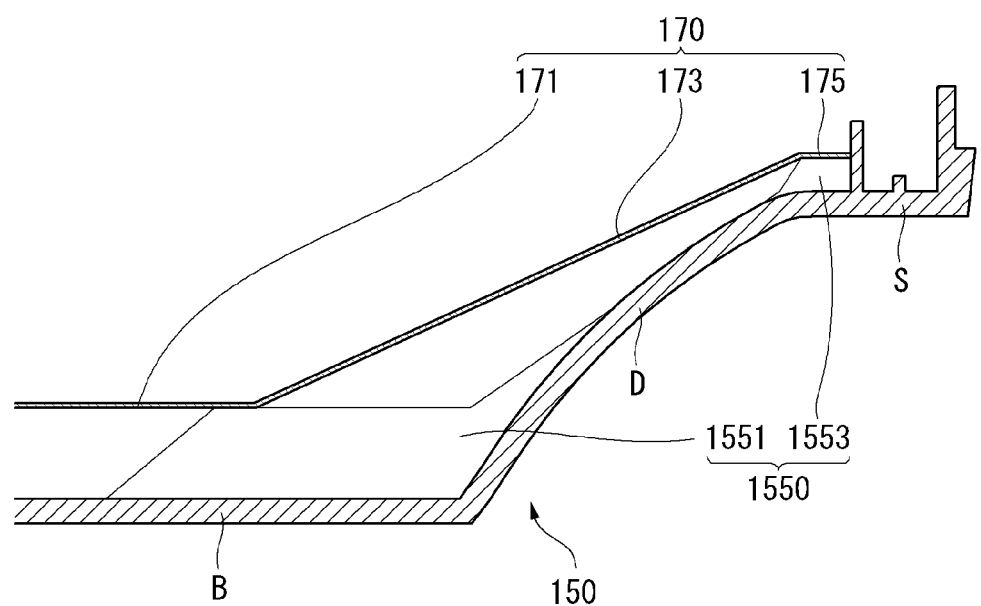
Figure 15:
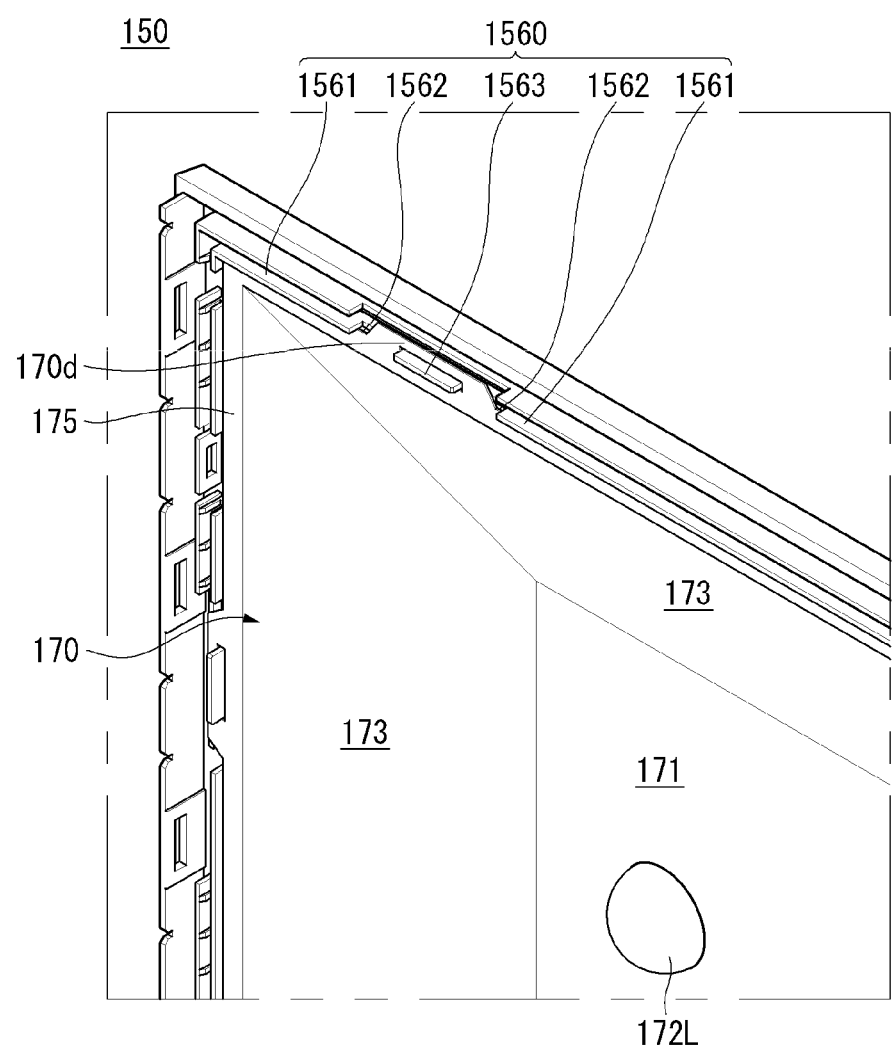

FIGS. 13 to 15 illustrate examples of the reflective sheet according to an example embodiment of the invention.

The reflective sheet 170 may be positioned at front surfaces of the substrates 172 and 174. The reflective sheet 170 may be positioned in area except a formation area of the light assemblies 172L and 174L from the substrates 172 and 174. Namely, the reflective sheet 170 may have a plurality of holes.

The reflective sheet 170 may forwardly reflect light emitted from the light assemblies 172L and 174L. The reflective sheet 170 may include at least one of metal and metal oxide, each of which is a reflection material. The reflective sheet 170 may include metal and/or metal oxide having a high reflectance, for example, at least one of aluminum (Al), silver (Ag), gold (Au), and titanium dioxide ($TiO_2$).

The reflective sheet 170 may include a flat portion 171, an inclined portion 173, and a side portion 175. The flat portion 171 may be placed on the plate 160. The light assemblies 172L and 174L may be protruded or exposed from the flat portion 171 through a plurality of holes formed in the flat portion 171.

Referring to FIG. 14, a support rib 1551 may be formed on the bottom B and/or the inclined portion D, and a support rib 1553 may be formed on the inclined portion D and/or the side portion S. A support rib 1550 may support the reflective sheet 170. The support rib 1551 may support the flat portion 171 and/or the inclined portion 173 of the reflective sheet 170. The support rib 1553 may support the inclined portion 173 and/or the side portion 175 of the reflective sheet 170. The support rib 1550 shown in FIG. 14 may be one of the plurality of support ribs 1530, 1540, and 1550.

Referring to FIG. 15, the rear case 150 may include a fixing rib 1560. The fixing rib 1560 may be formed on the side portion S of the rear case 150. The fixing rib 1560 may forwardly protrude from the side portion S.

The fixing rib 1560 may include a guide wall 1561, a groove 1562, and a hanging wall 1563. The guide wall 1561 may forwardly protrude from the side portion S and may be extended along a direction of one side of the rear case 150. The groove 1562 and the hanging wall 1563 may be formed in the middle of the guide wall 1561. The guide wall 1561, the groove 1562, the hanging wall 1563, the groove 1562, and the guide wall 1561 may be sequentially positioned along a longitudinal direction of the fixing rib 1560. For example, the three hanging walls 1563 may be sequentially positioned on a long side LS of the rear case 150 in the left-right direction.

One end of the reflective sheet 170 may be coupled with the fixing rib 1560. A coupling portion 170d may be formed on one side of the reflective sheet 170 and may be inserted into the hanging wall 1563 of the fixing rib 1560.

Figure 16:
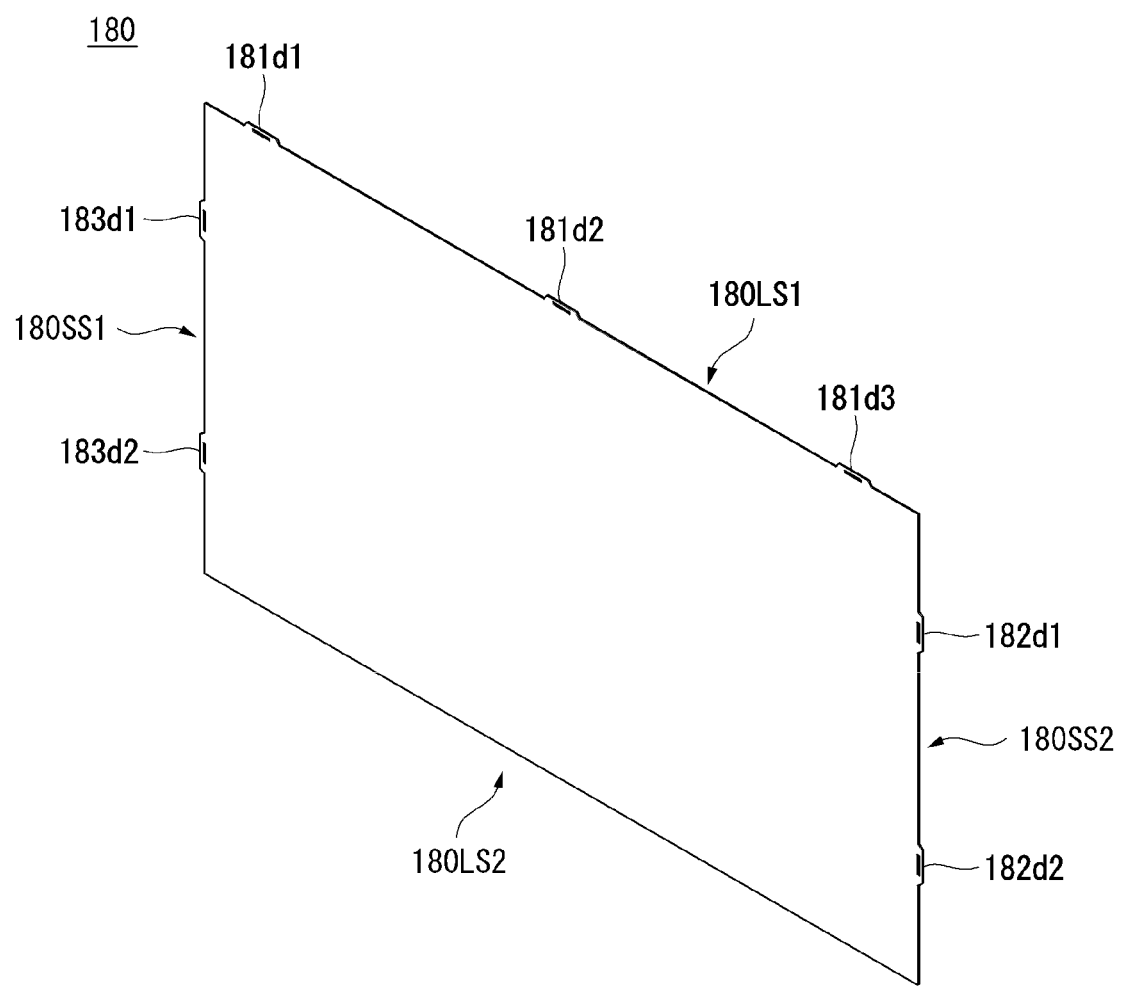
FIGS. 16 to 18 illustrate examples of an optical layer according to an example embodiment of the invention.
Figure 17:
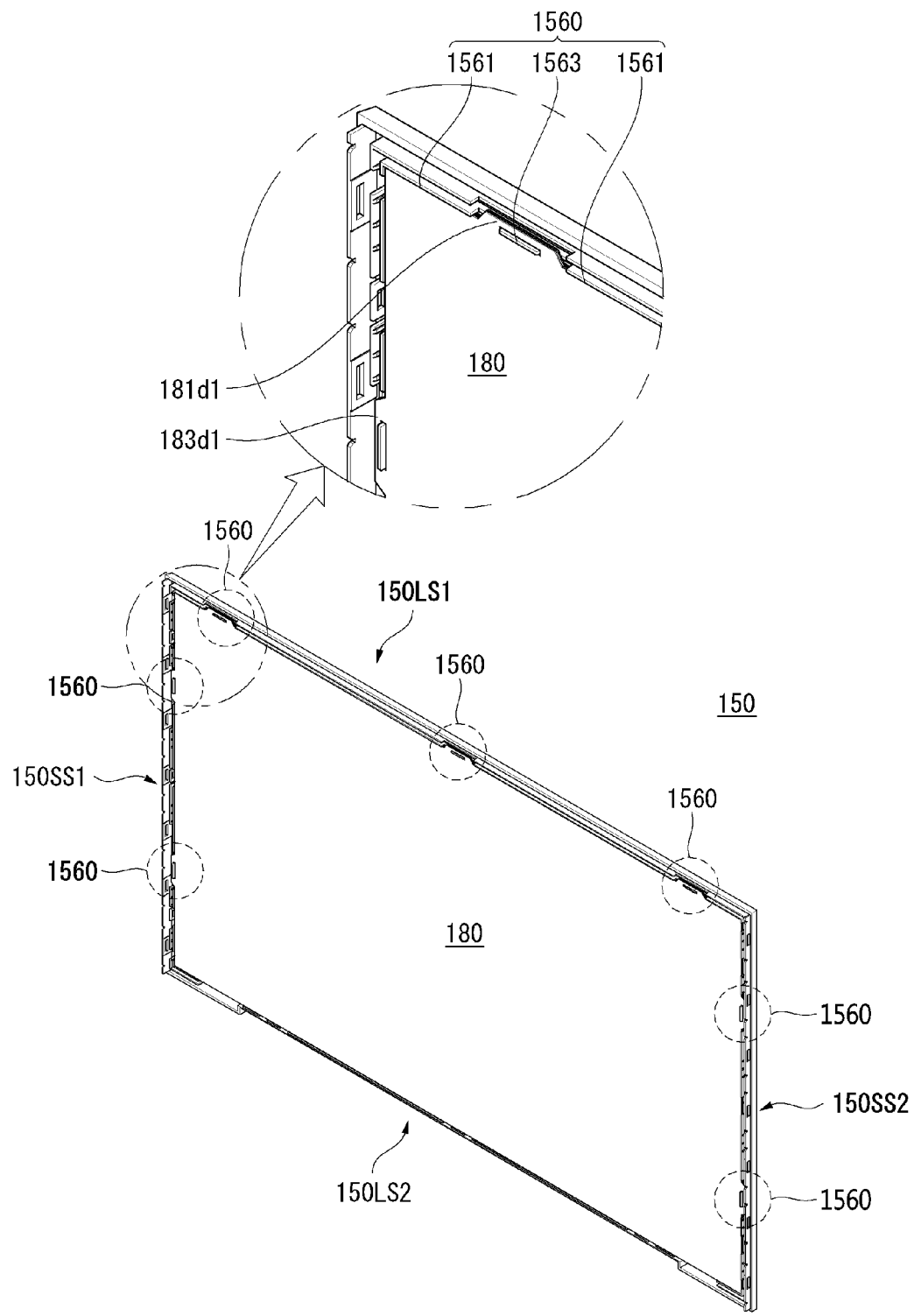
Figure 18:
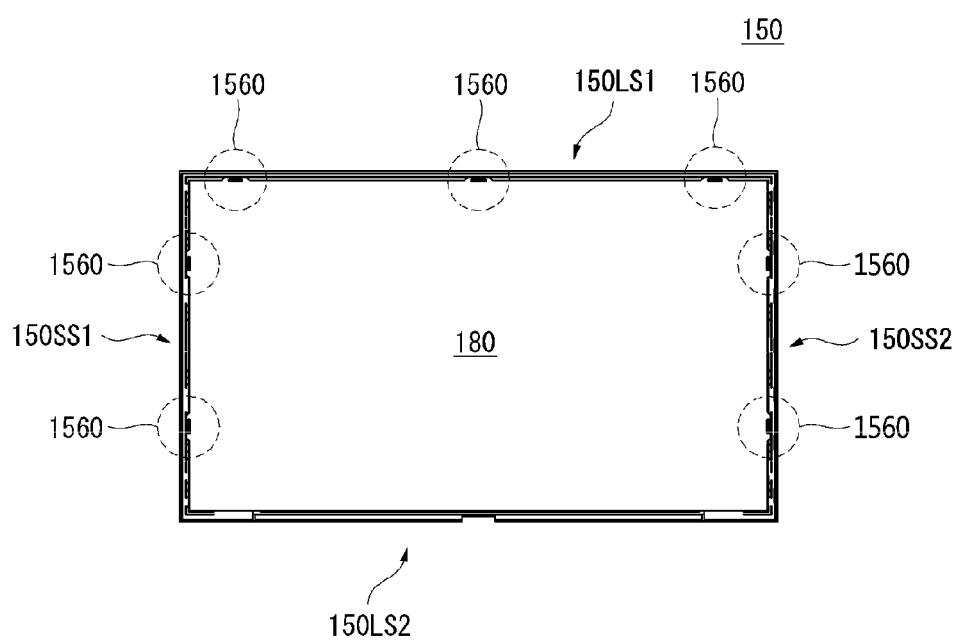

FIGS. 16 to 18 illustrate examples of the optical layer according to an example embodiment of the invention. In the embodiment disclosed herein, the optical layer may be referred to as an optical sheet.

Referring to FIG. 16, an optical sheet 180 may cause light of the light sources of the light assemblies 172L and 174L to be uniformly transferred to the display panel 110. The optical sheet 180 may include a plurality of layers. For example, the optical sheet 180 may include at least one prism sheet and/or at least one diffusion sheet.

The optical sheet 180 may include at least one sheet. More specifically, the optical sheet 180 may include one or more prism sheets and/or one or more diffusion sheets. The plurality of sheets included in the optical sheet 180 may be attached and/or adhered to one another.

The diffusion sheet may prevent light coming from a light guide plate from being partially concentrated and may further uniformize a distribution of the light. The prism sheet may concentrate light coming from the diffusion sheet and may make the concentrated light be vertically incident on the display panel 110.

The optical sheet 180 may further include one or more coupling portions 181d, 182d, and 183d. The coupling portions 181d, 182d, and 183d may be coupled with the fixing rib 1560 of the rear case 150. Namely, the coupling portions 181d, 182d, and 183d may be directly coupled to the rear case 150.

The optical sheet 180 may include the plurality of coupling portions 181d, 182d, and 183d. The reflective sheet 170 may further include a plurality of coupling portions 170d.

The plurality of first coupling portions 181d may be formed on a first long side 180LS1 of the optical sheet 180. The plurality of first coupling portions 181d may be sequentially arranged on the first long side 180LS1 of the optical sheet 180. For example, three first coupling portions 181d1, 181d2, and 181d3 may be formed.

The plurality of second coupling portions 182d may be formed on a second short side 180SS2 of the optical sheet 180. The plurality of second coupling portions 182d may be sequentially arranged on the second short side 180SS2 of the optical sheet 180. For example, two second coupling portions 182d1 and 182d2 may be formed.

The plurality of third coupling portions 183d may be formed on a first short side 180SS1 of the optical sheet 180. The plurality of third coupling portions 183d may be sequentially arranged on the first short side 180SS1 of the optical sheet 180. For example, two third coupling portions 183d1 and 183d2 may be formed.

Referring to FIG. 17, the plurality of coupling portions 181d, 182d, and 183d may be coupled with the fixing rib 1560. The guide wall 1561 may be positioned opposite the side of the optical sheet 180 and may limit a location of the optical sheet 180. Hence, the optical sheet 180 may be coupled with the rear case 150 at a predetermined position.

Referring to FIG. 18, the fixing rib 1560 may be positioned on a first long side 150LS1, a first short side 150SS1, and/or a second short side 150SS2 of the rear case 150. For example, the three fixing ribs 1560 may be sequentially formed on the first long side 150LS1 of the rear case 150 along a longitudinal direction of the first long side 150LS1. For example, the two fixing ribs 1560 may be sequentially formed on the first short side 150SS1 of the rear case 150 along a longitudinal direction of the first short side 150SS1.

For example, the two fixing ribs 1560 may be sequentially formed on the second short side 150SS2 of the rear case 150 along a longitudinal direction of the second short side 150SS2.

FIGS. 19 to 24 illustrate examples of coupling the components of the display panel according to an example embodiment of the invention.

Figure 19:
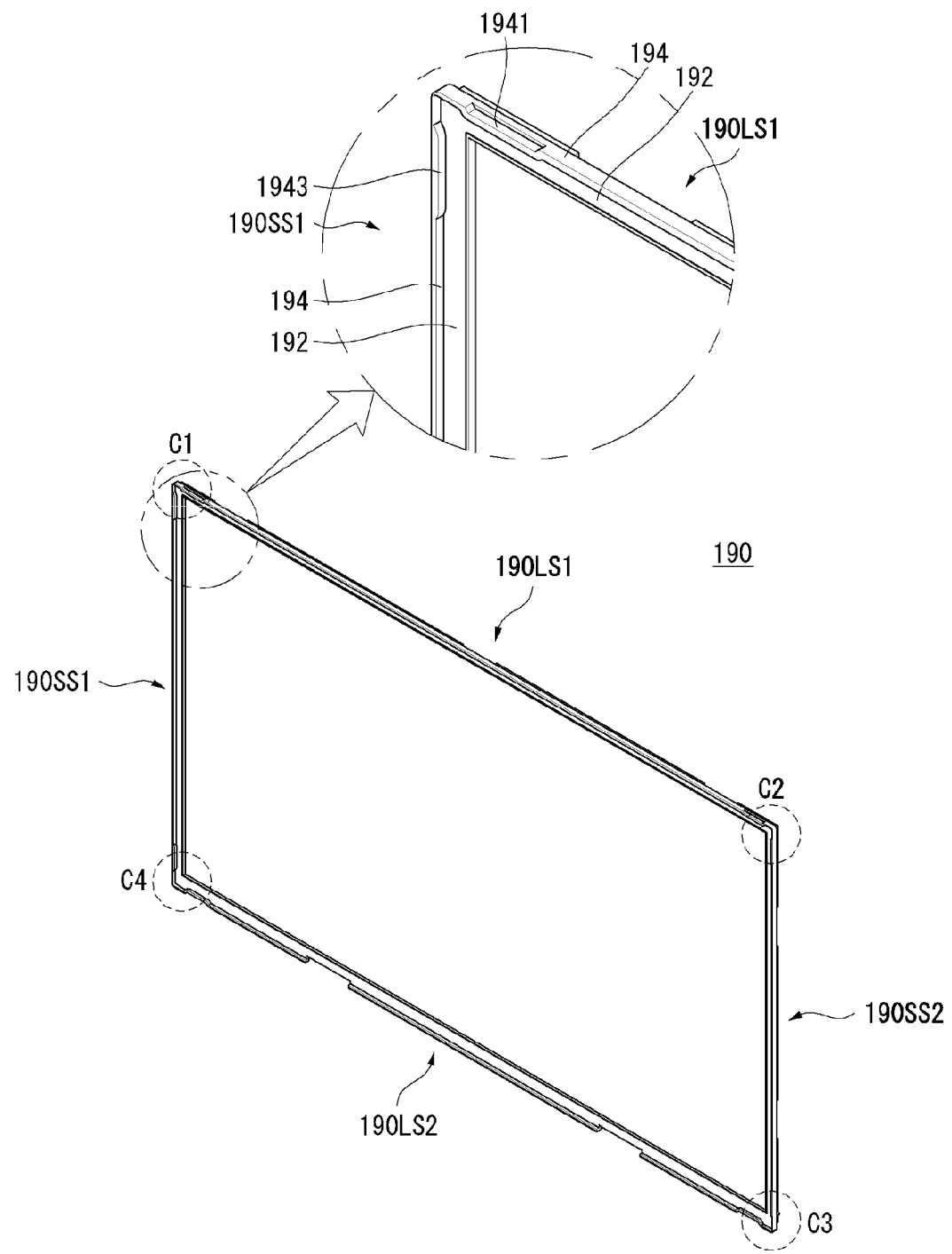
FIGS. 19 to 24 illustrate examples of coupling components of a display panel according to an example embodiment of the invention.

Referring to FIG. 19, a guide panel 190 may be coupled with the rear case 150. The guide panel 190 may correspond to a size of the side portion S of the rear case 150. The guide panel 190 may be coupled with the side portion S of the rear case 150.

The guide panel 190 may support the display panel 110. The guide panel 190 may include a horizontal portion 192 and a vertical portion 194. The horizontal portion 192 may entirely form a front surface of the guide panel 190, and the vertical portion 194 may entirely form a side of the guide panel 190. The horizontal portion 192 and the vertical portion 194 may be formed as one body.

The horizontal portion 192 may support the display panel 110. The horizontal portion 192 may include support portions 1941 and 1943. The support portions 1941 and 1943 may be formed on the vertical portion 194. The support portions 1941 and 1943 may be opposite to the side of the display panel 110 at an edge of the horizontal portion 192. Namely, the support portions 1941 and 1943 may limit a location of the display panel 110 at the edge of the horizontal portion 192. For this, the support portions 1941 and 1943 may protrude to the inside of the horizontal portion 192 at the edge of the horizontal portion 192.

For example, the support portions 1941 and 1943 may be positioned adjacent to a first corner C1 of the guide panel 190. In this instance, the support portion 1941 may be formed on a first long side 190LS1 of the guide panel 190, and the support portion 1943 may be formed on a first short side 190SS1 of the guide panel 190. The support portions 1941 and 1943 may limit a location of the display panel 110 while facing or contacting a first long side LS1 and a first short side SS1 of the display panel 110. The horizontal portion 192 may support the back surface of the display panel 110.

Figure 20:
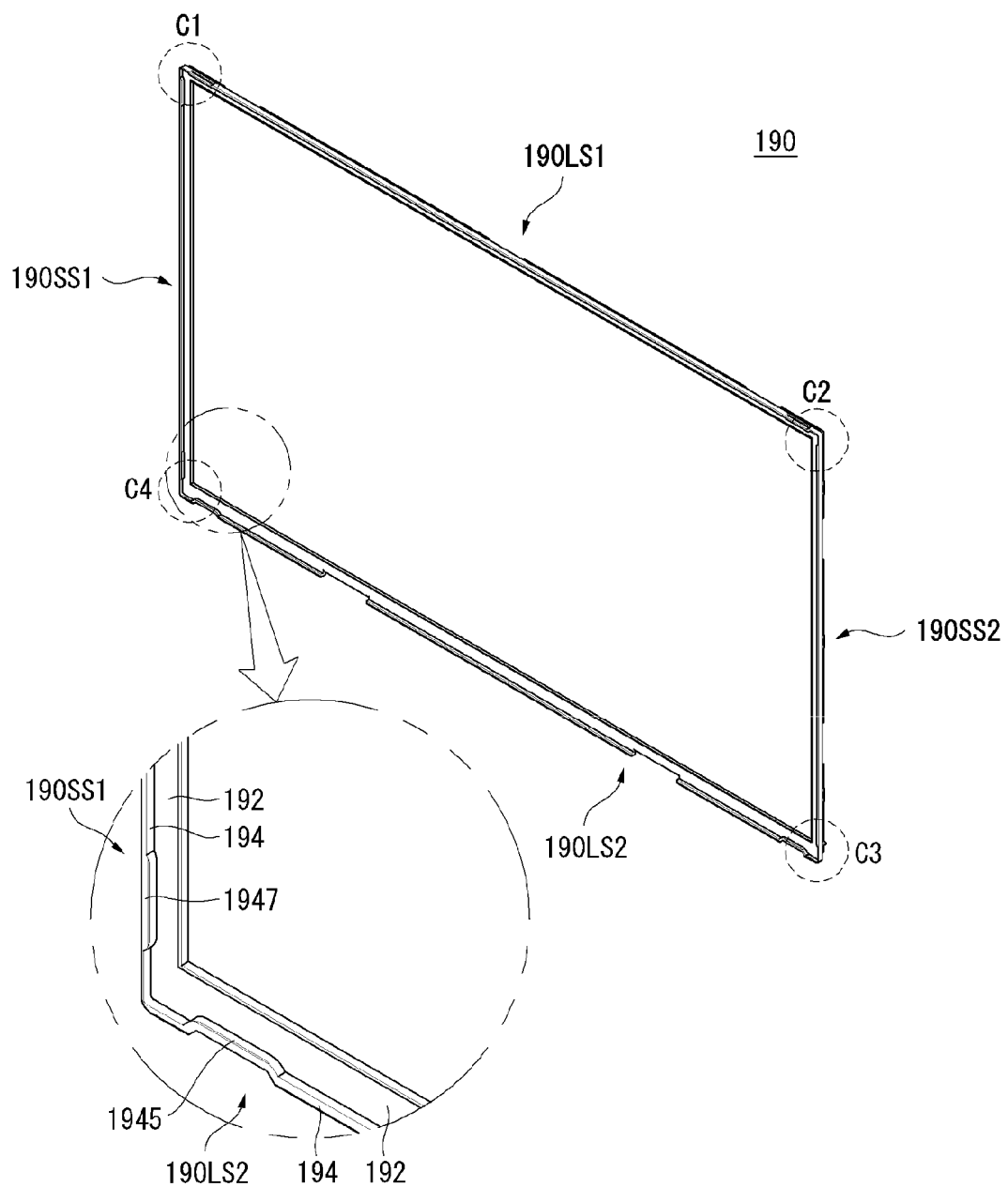

Referring to FIG. 20, for example, the support portions 1945 and 1947 may be positioned adjacent to a fourth corner C4 of the guide panel 190. In this instance, the support portion 1945 may be formed on a second long side 190LS2 of the guide panel 190, and the support portion 1947 may be formed on the first short side 190SS1 of the guide panel 190. The support portions 1945 and 1947 may limit a location of the display panel 110 while facing or contacting a second long side LS2 and the first short side SS1 of the display panel 110. The horizontal portion 192 may support the back surface of the display panel 110.

Figure 21:
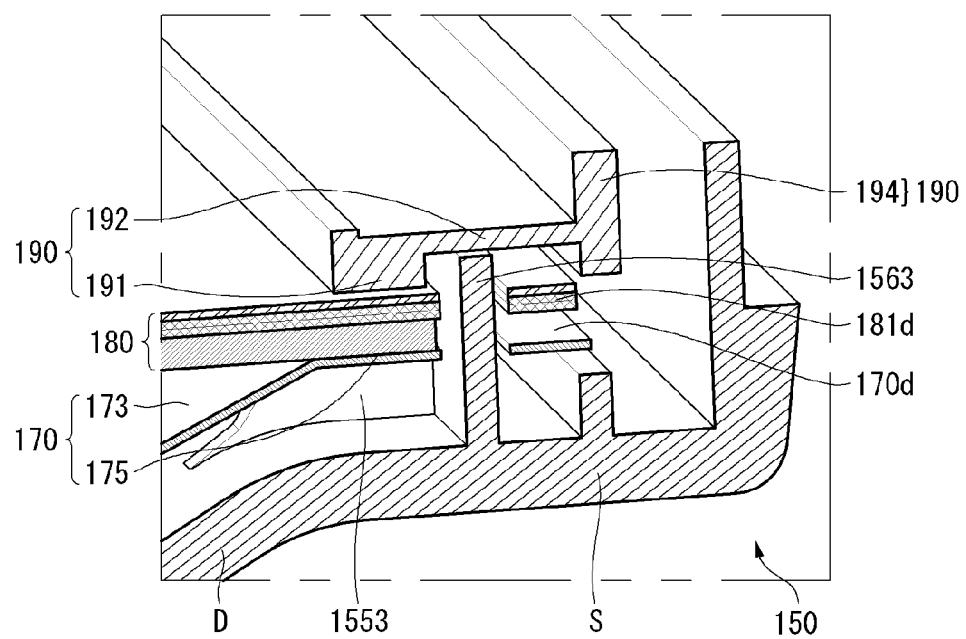

Referring to FIG. 21, the support rib 1553 may be formed on the inclined portion D or the side portion S of the rear case 150. The support rib 1553 may be forwardly protruded or extended from the inclined portion D or the side portion S of the rear case 150. The support rib 1553 may separate the reflective sheet 170 from the rear case 150 at a predetermined distance. Namely, the support rib 1553 may support a portion of a lower surface of the reflective sheet 170.

The reflective sheet 170 may include a coupling portion 170d in the same manner as the optical sheet 180. The coupling portion 170d of the reflective sheet 170 may be inserted into the hanging wall 1563 of the fixing rib 1560.

The optical sheet 180 may be positioned in front of the reflective sheet 170. In another point of view, the optical sheet 180 may be positioned on the reflective sheet 170. In this instance, the coupling portion 181d of the optical sheet 180 may be inserted into the hanging wall 1563 of the fixing rib 1560. At the same time, the hanging wall 1563 of the fixing rib 1560 may limit a location of the reflective sheet 170 and/or a location of the optical sheet 180. Namely, the hanging wall 1563 of the fixing rib 1560 may fix the reflective sheet 170 and/or the optical sheet 180 to the inside of the display device 100.

The guide panel 190 may be placed on the hanging wall 1563 or the guide wall 1561 of the fixing rib 1560. The guide panel 190 may be positioned in front of the rear case 150, and the horizontal portion 192 of the guide panel 190 may be positioned on the fixing rib 1560. The horizontal portion 192 may contact or may be positioned adjacent to the hanging wall 1563 or the guide wall 1561 of the fixing rib 1560.

The guide panel 190 may include a pressing portion 191. The pressing portion 191 may be formed at a lower surface of the horizontal portion 192 of the guide panel 190. The pressing portion 191 may press a portion of the upper surface of the optical sheet 180. The pressing portion 191 may press an outer portion of the optical sheet 180. Thus, the reflective sheet 170 and the optical sheet 180 may be supported by the support rib 1553 and may be fixed to the inside of the rear case 150 while receiving a pressing force applied by the pressing portion 191 of the guide panel 190.

Figure 22:
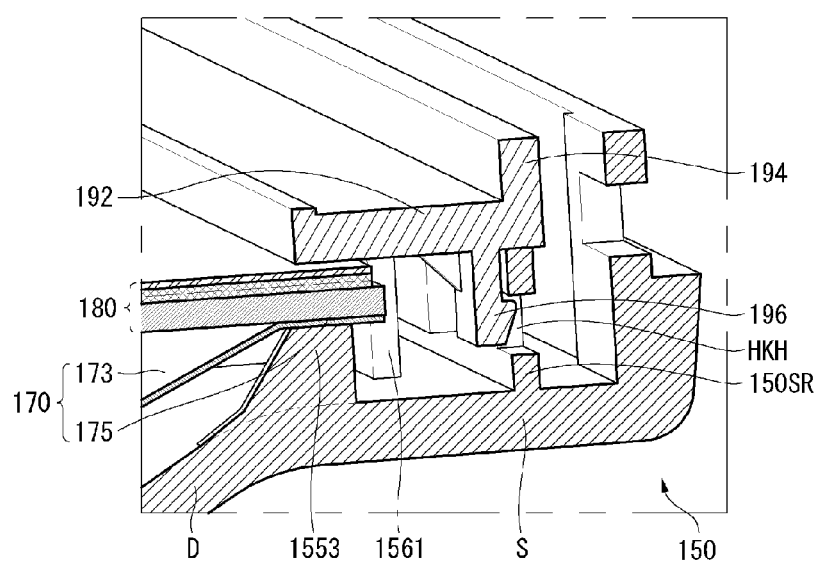

Referring to FIG. 22, the guide panel 190 may have a hook 196. The rear case 150 may include a hook groove HKH. The hook 196 may be formed at a lower end of the vertical portion 194 or the horizontal portion 192 of the guide panel 190. Namely, the hook 196 may be formed in the rear of the guide panel 190. The hook groove HKH may be formed on a rib 150SR forwardly protruded or extended from the side portion S of the rear case 150. Hence, the guide panel 190 may be coupled with the rear case 150 while being inserting into the front of the rear case 150.

Figure 23:
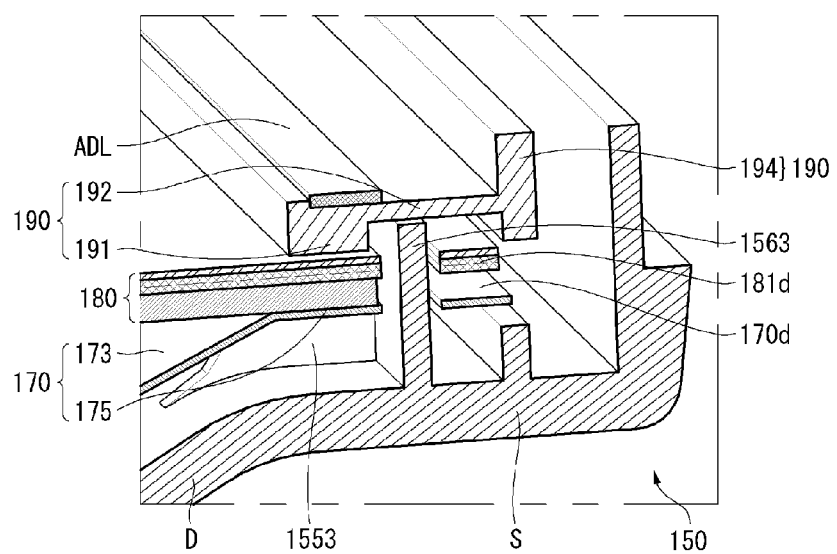

Referring to FIG. 23, an adhesive member ADL may be attached to a front surface of the guide panel 190. The adhesive member ADL may be attached to the horizontal portion 192 of the guide panel 190. In this instance, the adhesive member ADL may have a length corresponding to a length of the guide panel 190 or a length of the horizontal portion 192.

Figure 24:
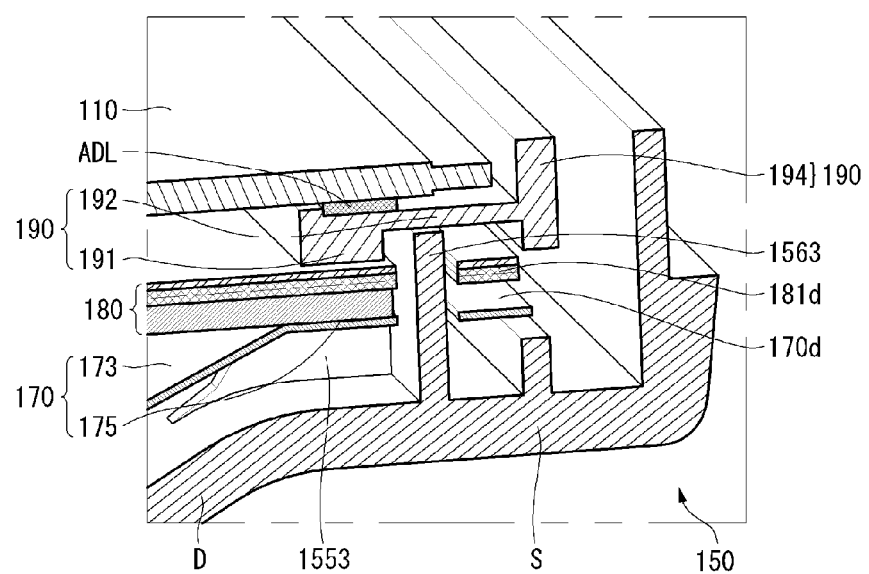

Referring to FIG. 24, the display panel 110 may be placed on the front surface of the guide panel 190. The guide panel 190 may support the display panel 110. The horizontal portion 192 of the guide panel 190 may be adjacent to or may contact the back surface of the display panel 110. Further, the display panel 110 may be fixed to the guide panel 190 by the adhesive member ADL. The side of the display panel 110 may be opposite to the vertical portion 194 of the guide panel 190. The vertical portion 194 of the guide panel 190 may be separated from the side of the display panel 110 while being adjacent to the side of the display panel 110.

Figure 25:
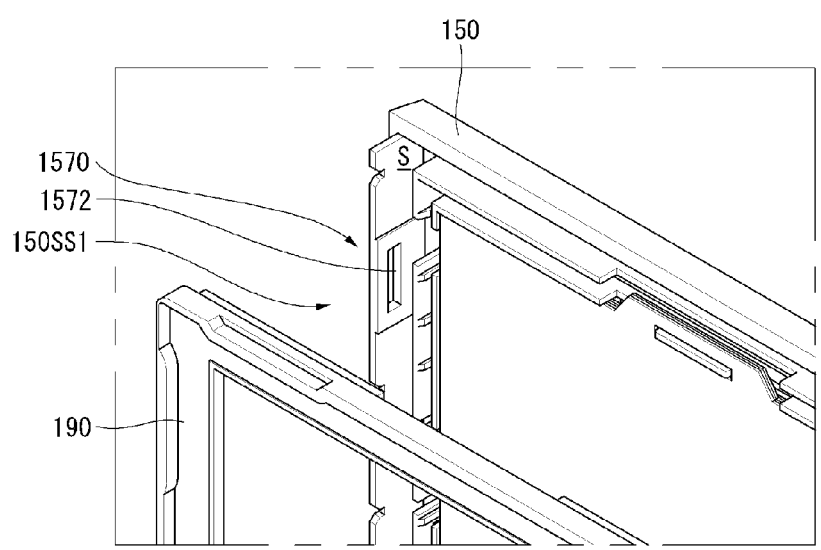
FIGS. 25 to 27 illustrate examples of coupling a rear case and a front cover according to an example embodiment of the invention.
Figure 26:
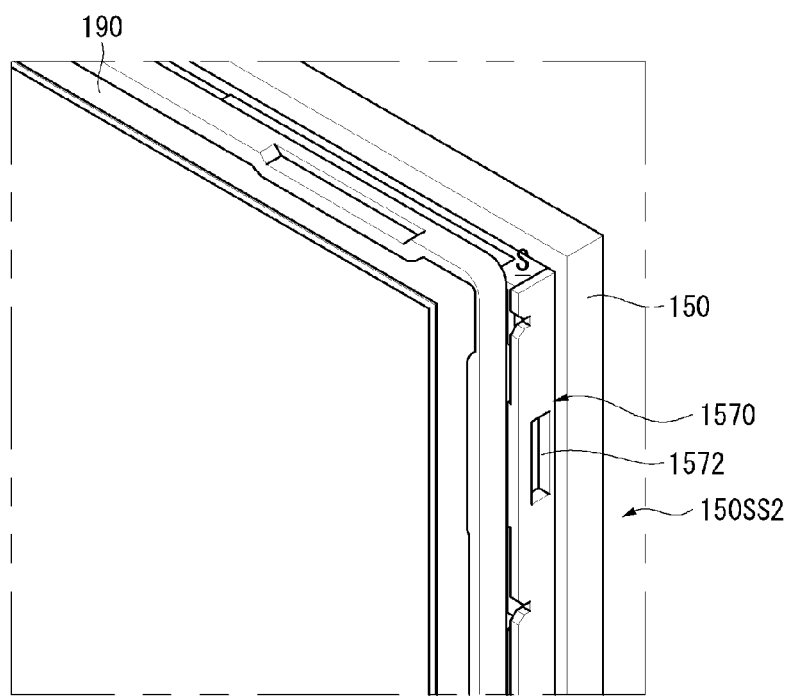
Figure 27:
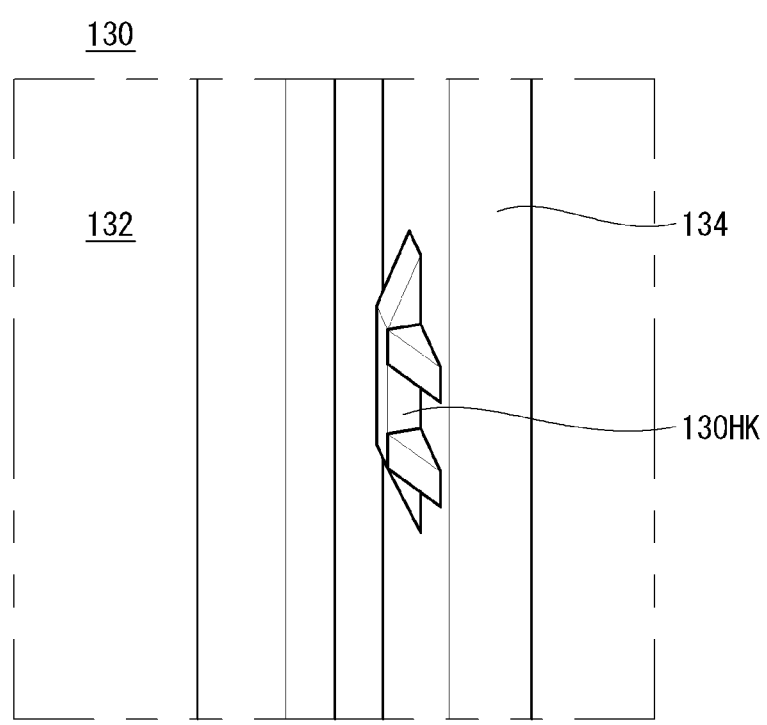

FIGS. 25 to 27 illustrate examples of coupling the rear case and the front cover according to an example embodiment of the invention.

Referring to FIGS. 25 and 26, the rear case 150 may include a side rib 1570. The side rib 1570 may be formed on the side portion S of the rear case 150. The side rib 1570 may be forwardly protruded or extended from the rear case 150. For example, the side rib 1570 may be positioned on a first short side 150SS1 and/or a second short side 150SS2 of the rear case 150.

The side rib 1570 may include a hanging groove 1572. The hanging groove 1572 may be formed on the side of the side rib 1570. The hanging groove 1572 may be formed on an outside surface of the side rib 1570. The outside surface of the side rib 1570 may be a surface facing the outside of the rear case 150.

The hanging groove 1572 may be positioned on the upper left side or the upper right side of the rear case 150. Further, the hanging groove 1572 may be positioned on the lower left side or the lower right side of the rear case 150. Further, the hanging groove 1572 may be positioned in the middle of the left side or the right side of the rear case 150. The hanging groove 1572 may be positioned on the upper side, the middle side, and/or the lower side of the rear case 150 on the side rib 1570.

Referring to FIG. 27, the front cover 130 may include a hook 130HK. The front cover 130 may include a front cover portion 132 and a side cover portion 134. The hook 130HK may be formed on the side cover portion 134 of the front cover 130. The hook 130HK may be formed on an inside surface of the side cover portion 134. The hook 130HK may be formed by protruding the inside surface of the side cover portion 134.

Figure 28:
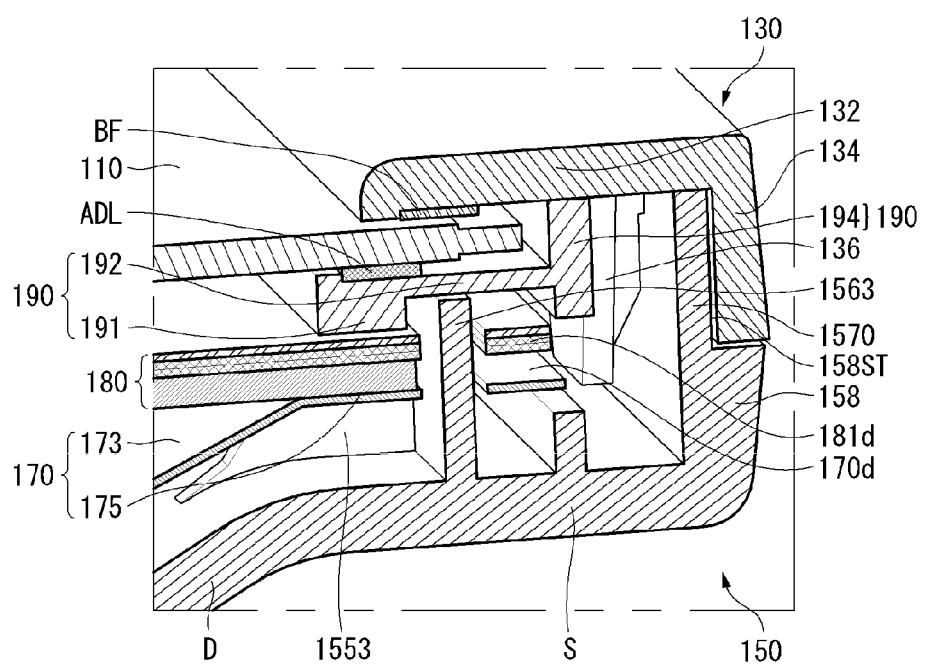
FIG. 28 illustrates an example of a cross section of a display device according to an example embodiment of the invention.

FIG. 28 illustrates an example of a cross section of the display device according to an example embodiment of the invention.

The rear case 150 may include a side portion 158. The side portion 158 of the rear case 150 may be formed on the side portion S of the rear case 150. The side portion 158 of the rear case 150 may be extended toward the front of the rear case 150. In this instance, the side portion 158 may form a stepped portion 158ST. The stepped portion 158ST of the side portion 158 may be formed from an outside surface of the side portion 158 toward the inside of the rear case 150. The stepped portion 158ST of the side portion 158 may be formed by the side portion 158 and the side rib 1570.

The front cover portion 132 of the front cover 130 may be positioned on a portion of the front surface of the display panel 110. Namely, a portion of the front cover portion 132 of the front cover 130 may be positioned adjacent to an edge of the display panel 110. A portion of the front cover portion 132 of the front cover 130 may cover a portion of an outer portion of the display panel 110. In this instance, the vertical portion 194 of the guide panel 190 may support the front cover portion 132 of the front cover 130.

The side cover portion 134 of the front cover 130 may be positioned on the stepped portion 158ST of the side portion 158 of the rear case 150. As the front cover 130 is coupled with the rear case 150, the hook 130HK formed on the side cover portion 134 of the front cover 130 may be inserted into the hanging groove 1572 formed on the side rib 1570 of the rear case 150. Hence, the front cover 130 may be coupled with the rear case 150.

The front cover 130 may include a coupling guide rib 136. The coupling guide rib 136 may be protruded or extended from the inside of the front cover portion 132 of the front cover 130. The coupling guide rib 136 may be inserted into the guide panel 190 and the side rib 1570.

A buffer member BF may be positioned between the front cover 130 and the display panel 110. The buffer member BF may be attached to the front cover portion 132 of the front cover 130. The buffer member BF may be attached to an inside surface of the front cover portion 132 of the front cover 130. Hence, the display panel 110 may be prevented from being damaged by the front cover 130.

Figure 29:
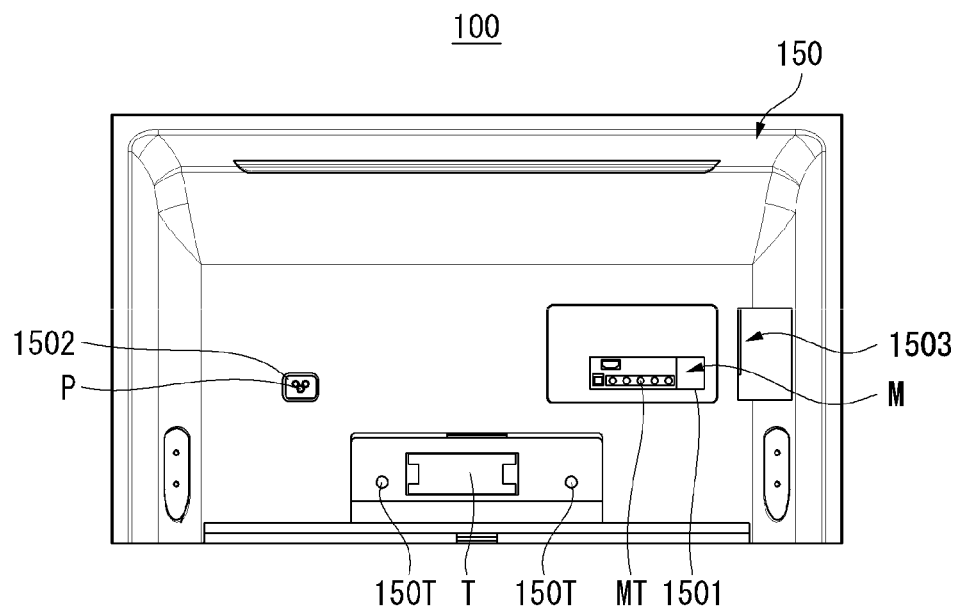
FIGS. 29 to 31 illustrate examples of a rear of a display device according to an example embodiment of the invention.
Figure 30:
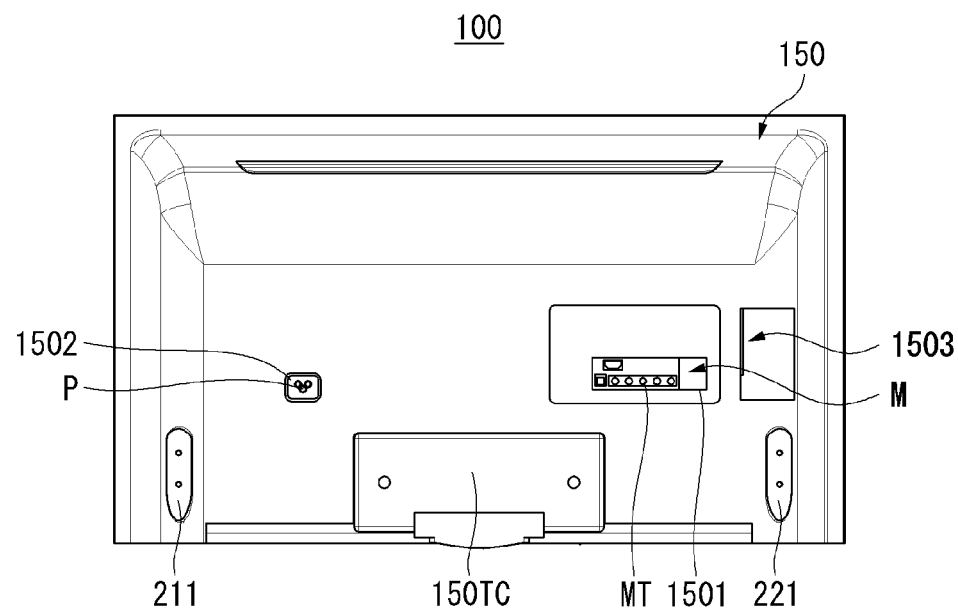
Figure 31:
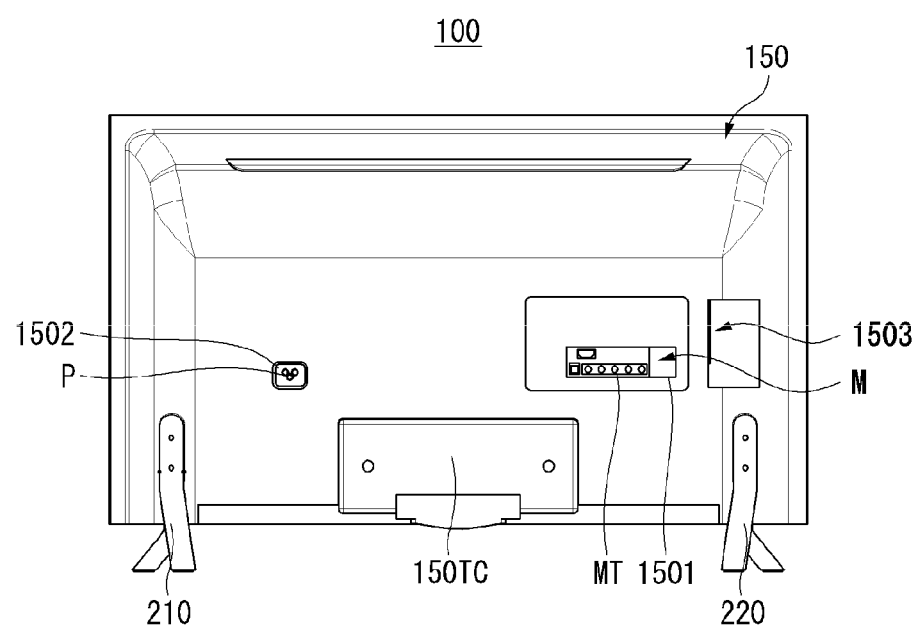

FIGS. 29 to 31 illustrate examples of a rear of the display device according to an example embodiment of the invention.

Referring to FIG. 29, a timing controller board T may be installed in the rear or at the back surface of the rear case 150. The main board M and the power supply unit P, which are described above, may be electrically connected to the timing controller board T. The timing controller board T may be a printed circuit board for transmitting electric power or signals received from the main board M or the power supply unit P to the display panel 110. The timing controller board T may be electrically connected to the display panel 110 through flat flex cables.

Terminals MT of the main board M may be exposed to the outside of the display device 100 through a first opening 1501. Other terminals MT of the main board M may be exposed to the outside of the display device 100 through a second opening 1503. Hence, the terminals MT of the main board M may be connected to input and output terminals at the outside of the display device 100.

The power supply unit P may be exposed to the outside of the display device 100 through a third opening 1502. Hence, electric cables may be directly connected to the power supply unit P through the third opening 1502 at the outside of the display device 100.

A coupling groove 150T may be formed at the back surface of the rear case 150. The coupling groove 150T may be positioned adjacent to the timing controller board T. For example, the two coupling grooves 150T may be formed on both sides of the timing controller board T.

Referring to FIG. 30, a back cover 150TC may be coupled with the back surface of the rear case 150. The back cover 150TC may cover the timing controller board T. The back cover 150TC may be coupled with the rear case 150 while being inserted into the coupling groove 150T formed on the back surface of the rear case 150. Hence, the timing controller board T may be easily repaired or replaced without disassembling the display device 100.

Referring to FIG. 31, stands 210 and 220 may be coupled with the back surface of the rear case 150. The stands 210 and 220 may be coupled with the lower left side and/or the lower right side of the rear case 150. The stands 210 and 220 may be inserted into the rear case 150 or may be screw-coupled with the rear case 150.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a display panel;
   a rear case at a rear of the display panel, a back surface of the rear case being exposed to an outside of the display device, and a front surface of the rear case facing the display panel, the rear case including an accommodation space opened toward the display panel;
   a backlight unit located between the display panel and the rear case, the backlight unit being configured to provide the display panel with light;
   a plurality of ribs extending from the front surface of the rear case and contacting at least a portion of the backlight unit; and
   a boss forwardly extended from the front surface of the rear case;
   a controller coupled with the boss, the controller positioned between the backlight unit and the rear case; and
   a plate accommodated in the accommodation space of the rear case, the plate being positioned between the backlight unit and the controller, and the plate being coupled to the rear case.

2. The display device of claim 1,
   wherein the rear case includes an opening adjacent to the controller, and
   wherein the controller is positioned between the plate and the opening.

3. The display device of claim 1, wherein the controller includes a main board or a power supply unit.

4. The display device of claim 1, wherein the plate includes metal, and
   wherein the plate contacts the controller.

5. The display device of claim 1, further comprising:
   a speaker positioned between the plate and the rear case.

6. The display device of claim 1,
   wherein the backlight unit includes:
     a substrate; and
     a light assembly mounted on the substrate, the substrate being attached to the plate.

7. The display device of claim 6, wherein the backlight unit further includes a reflective sheet located between the plate and the display panel, the reflective sheet having a hole into which at least a portion of the light assembly is inserted, and the reflective sheet having a coupling portion protruding from a side of the reflective sheet,
   wherein a back surface of the reflective sheet is supported by a first rib of the plurality of ribs, and
   wherein the coupling portion of the reflective sheet is fixed to a second rib of the plurality of ribs.

8. The display device of claim 7, wherein the backlight unit further includes an optical sheet located between the reflective sheet and the display panel, the optical sheet having a coupling portion protruding from a side of the optical sheet, and
   wherein the coupling portion of the optical sheet is fixed to the second rib of the plurality of ribs.

9. The display device of claim 8, wherein the rear case includes:
   a rear portion;
   an inclined portion extending from the rear portion toward the display panel; and
   a side portion extending from the inclined portion to form an outer periphery of the rear case,
   wherein the display device further comprises a guide panel positioned in front of the inclined portion or the side portion, the guide panel being supported by the second rib of the plurality of ribs, and the guide panel supporting a portion of a back surface of the display panel.

10. The display device of claim 9, wherein the guide panel includes:
- a first portion supported by the second rib of the plurality of ribs, the first portion extending in a first direction;
- a second portion connected to the first portion, the second portion extending in a second direction different from the first direction, and the second portion being positioned opposite a side of the display panel; and
- a pressing portion on a rear surface of the first portion, the pressing portion contacting a front surface of the optical sheet.

11. The display device of claim 10, further comprising an adhesive member located between the first portion and the display panel, the adhesive member being attached to both the first portion and the display panel.

12. The display device of claim 9, wherein the guide panel includes:
- a first portion extending in a first direction; and
- a hook extending away from the first portion in a second direction different from the first direction,
- wherein the second rib includes a groove, and the second rib is adjacent to the first portion, and
- wherein the hook of the guide panel is inserted into the groove of the second rib.

13. The display device of claim 1, further comprising a front cover covering a portion of a front surface of the display panel, the front cover being coupled to the rear case at a side of the rear case.

14. The display device of claim 13, wherein the rear case includes:
- a rear portion;
- an inclined portion extending from the rear portion toward the display panel; and
- a side portion extending from the inclined portion to form an outer periphery of the rear case; and
- a side rib extending from the side portion toward the front cover, the side rib having a groove, and
- wherein the front cover includes a hook, and the hook is inserted into the groove.

15. The display device of claim 1, wherein the rear case includes:
- a rear portion;
- an inclined portion extending from an edge of the rear portion toward an edge of the display panel; and
- a side portion extending from the inclined portion, the side portion being located behind the edge of the display panel,
wherein the plurality of ribs includes:
- a support rib extending from the rear portion or the inclined portion toward a front of the rear case; and
- a fixing rib positioned on the side portion, the fixing rib being adjacent to the inclined portion, the fixing rib extending toward the front of the rear case, and
wherein the backlight unit includes:
- a reflective sheet located between the display panel and the rear portion, the reflective sheet being supported by the support rib, and the reflective sheet being hung on the fixing rib;
- an optical sheet located between the display panel and the reflective sheet, and the optical sheet being hung on the fixing rib; and
- a guide panel supported from an upper end of the fixing rib, the guide panel supporting an outer portion of a back surface of the display panel, and a portion of the guide panel being located between the display panel and the optical sheet.

16. The display device of claim 1, wherein the plate includes metal,
- wherein the rear case includes an opening adjacent to the controller,
- wherein the controller is positioned between the plate and the opening, and
- wherein the plate contacts the controller.

17. The display device of claim 16, wherein at least a portion of the backlight unit contacts the plate or is attached to the plate.

18. A display device comprising:
- a display panel;
- a rear case at a rear of the display panel, a back surface of the rear case being exposed to an outside of the display device, and a front surface of the rear case facing the display panel, the rear case including an accommodation space opened toward the display panel;
- a backlight unit located between the display panel and the rear case, the backlight unit being configured to provide the display panel with light;
- a plurality of ribs extending from the front surface of the rear case and contacting at least a portion of the backlight unit;
- a plurality of bosses extending from the front surface of the rear case toward the backlight unit,
- a guide rib adjacent to at least one boss of the plurality of bosses, the guide rib extending from the front surface of the rear case toward the backlight unit;
- a controller including a first hole, into which an upper end of the guide rib is inserted, and a second hole formed at a location corresponding to the at least one boss of the plurality of bosses; and
- a plate accommodated in the accommodation space of the rear case, the plate being positioned between the backlight unit and the controller, and the plate being coupled to the rear case.

19. The display device of claim 18, wherein the plate includes a plurality of holes, and
- wherein one hole of the plurality of holes of the plate and the second hole of the controller are connected to the at least one boss of the plurality of bosses.

20. The display device of claim 19, further comprising a holder located along one side edge of the plate or at one corner of the plate, the holder contacting or facing a side surface of the plate, and the holder limiting displacement of the plate in at least one direction.

* * * * *